United States Patent
Son et al.

(10) Patent No.: US 8,987,741 B2
(45) Date of Patent: Mar. 24, 2015

(54) THIN FILM TRANSISTOR ARRAY PANEL AND THE METHOD FOR MANUFACTURING THEREOF

(75) Inventors: Ock-Soo Son, Seoul (KR); Jeong-Uk Heo, Asan-si (KR); Yeon-Sik Ham, Suwon-si (KR); Yeon-Mun Jeon, Cheonan-si (KR); Jeong-Hyun Lee, Asan-si (KR)

(73) Assignee: Samsung Display Co., Ltd., Yongin (KR)

( * ) Notice: Subject to any disclaimer, the term of this patent is extended or adjusted under 35 U.S.C. 154(b) by 1065 days.

(21) Appl. No.: 13/034,583

(22) Filed: Feb. 24, 2011

(65) Prior Publication Data
US 2012/0104392 A1    May 3, 2012

(30) Foreign Application Priority Data

Nov. 2, 2010  (KR) .......................... 10-2010-0108184

(51) Int. Cl.
*H01L 27/12* (2006.01)
*G02F 1/1343* (2006.01)

(52) U.S. Cl.
CPC ....... *G02F 1/134363* (2013.01); *H01L 27/1214* (2013.01); *H01L 27/1259* (2013.01); *G02F 2001/134372* (2013.01)
USPC ................................ 257/59; 257/72; 349/141

(58) Field of Classification Search
CPC ............ G02F 1/134363; H01L 27/124; H01L 27/1214
USPC ....................................... 257/59, 72; 349/141
See application file for complete search history.

(56) References Cited

U.S. PATENT DOCUMENTS

| | | | |
|---|---|---|---|
| 6,707,524 B2 | 3/2004 | Kim et al. | |
| 7,206,052 B2 * | 4/2007 | Hong et al. | .................... 349/141 |
| 7,542,119 B2 | 6/2009 | Ko et al. | |
| 7,675,579 B2 | 3/2010 | Suzuki | |
| 7,746,436 B2 | 6/2010 | Shin et al. | |
| 2007/0222907 A1 | 9/2007 | Onogi et al. | |
| 2007/0285369 A1 * | 12/2007 | Park et al. | ....................... 345/90 |

FOREIGN PATENT DOCUMENTS

| | | |
|---|---|---|
| JP | 2005-141036 | 6/2005 |
| JP | 4260771 | 2/2009 |
| JP | 2010-020317 | 1/2010 |
| KR | 1020040012202 | 2/2004 |
| KR | 1020060025783 | 3/2006 |
| KR | 1020060095692 | 9/2006 |
| KR | 1020080048722 | 6/2008 |
| KR | 10-0865838 | 10/2008 |
| KR | 1020100065740 | 6/2010 |

* cited by examiner

*Primary Examiner* — Yu Chen
(74) *Attorney, Agent, or Firm* — H.C. Park & Associates, PLC

(57) ABSTRACT

Provided is a thin film transistor array panel that includes: a substrate; a gate line and a data line formed on the substrate and at least partially defining a pixel area; a thin film transistor connected to the gate line and the data line; a pixel electrode connected to the thin film transistor and formed in the pixel area; a first common electrode formed under the pixel electrode; a second common electrode formed on the pixel electrode. The pixel area includes an upper pixel area and a lower pixel area, the first common electrode is formed in the upper pixel area, and the second common electrode is formed in the lower pixel area. The pixel electrode includes an upper pixel electrode formed in the upper pixel area and a lower pixel electrode formed in the lower pixel area.

27 Claims, 29 Drawing Sheets

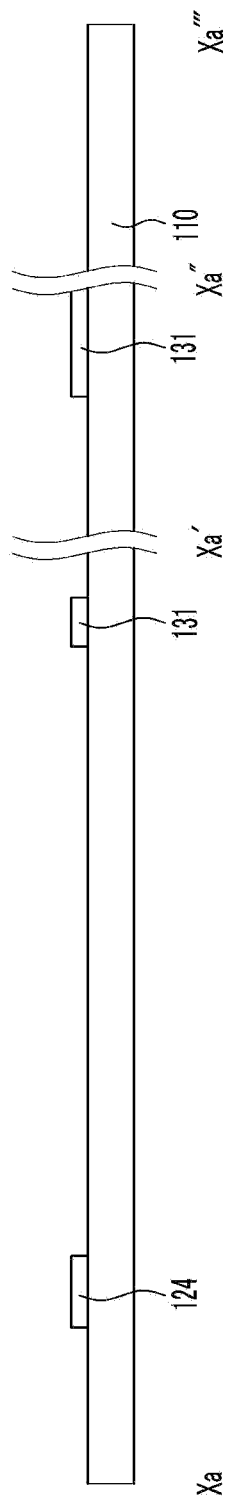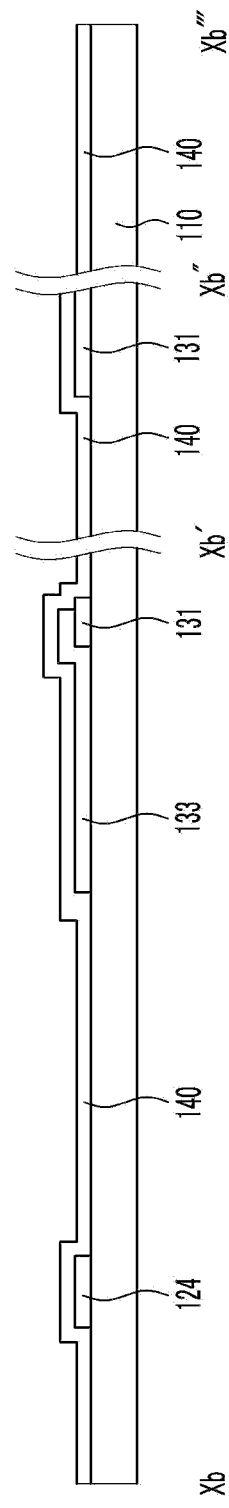

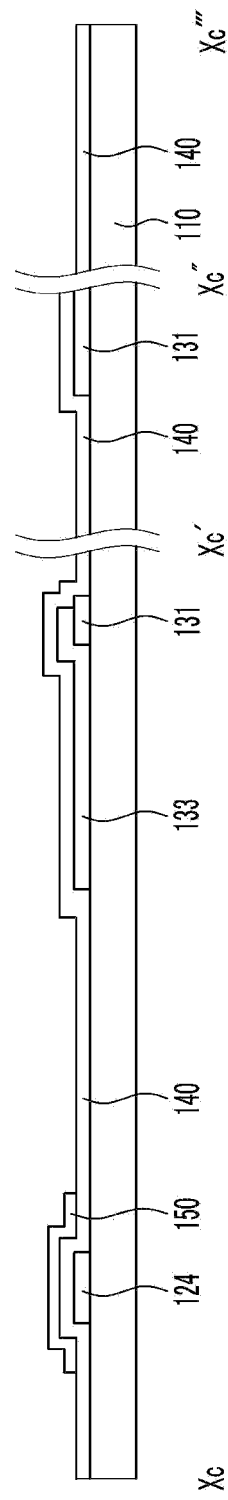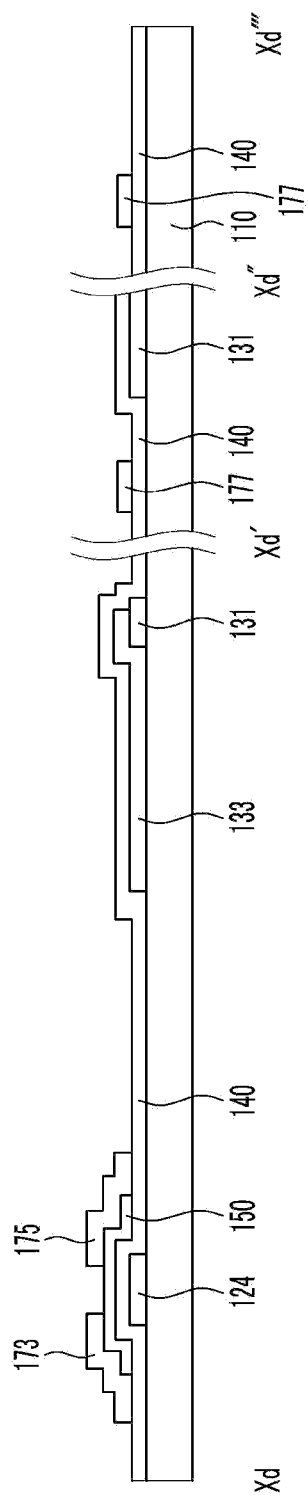

FIG.13

THIN FILM TRANSISTOR ARRAY PANEL AND THE METHOD FOR MANUFACTURING THEREOF

CROSS-REFERENCE TO RELATED APPLICATION

This application claims priority to and the benefit of Korean Patent Application No. 10-2010-0108184, filed in the Korean Intellectual Property Office on Nov. 2, 2010, which is hereby incorporated by reference for all purposes as if fully set forth herein.

BACKGROUND OF THE INVENTION

1. Field of the Invention

Various embodiments of the present invention relate to a thin film transistor array panel and a manufacturing method thereof.

2. Discussion of the Background

A liquid crystal display is currently one of the most widely used type of flat panel display. Such a display includes two display panels on which a pixel electrode and a common electrode are formed, and a liquid crystal layer that is disposed therebetween. A voltage is applied to the electrodes to generate an electric field in the liquid crystal layer, and thereby control the alignment of the liquid crystal molecules and control the polarization of incident light.

A liquid crystal display may be implemented in various modes, and among them, recently, research into a liquid crystal display driven in a plane line switching (PLS) mode has been actively conducted. In the PLS mode, the pixel electrode and the common electrode are formed on the same substrate, and an electric field is formed between the two electrodes to align liquid crystal molecules.

In this PLS mode, a jet inversion has been proposed to implement a dot inversion, while power consumption is reduced. On the basis of one data line, the thin film transistors protrude in different directions at adjacent columns, and the dot inversion may be implemented by applying a voltage according to a known column inversion method, to one line.

However, in this case, if an error occurs in an overlay manufacturing process, and a distance between pixel electrodes of both sides of the data line varies, there is a problem in that there is a capacitance difference between the pixel electrode disposed at the left of the data line and the capacitance of the pixel electrode disposed at the right of the data line.

In addition, when one color is displayed, since two adjacent data lines should be driven in order to drive pixels disposed in the corresponding column, there is a problem in that power consumption is increased.

In addition, when the same pattern is shown for a long time, ions that have the opposite polarity to the voltage applied to the pixel electrode are cornered, and a voltage drop occurs. Thus, when another pattern is shown thereafter, an afterimage remains and a flicker phenomenon occurs.

The above information disclosed in this Background section is only for enhancement of understanding of the background of the invention and therefore it may contain information that does not constitute prior art.

SUMMARY OF THE INVENTION

Aspects of the present invention provide a thin film transistor array panel that can prevent a difference of capacitance between a data line and a pixel electrode, due to overlay errors occurring during a manufacturing process thereof, and a manufacturing method thereof.

In addition, aspects of the present invention provide a thin film transistor array panel having reduced power consumption, due to driving only one data line adjacent to the corresponding column when one color is displayed, and a manufacturing method thereof.

In addition, aspects of the present invention provide a thin film transistor array panel that can prevent an afterimage and a flicker phenomenon, and a manufacturing method thereof.

An exemplary embodiment of the present invention provides a thin film transistor array panel including: a substrate; a gate line and a data line formed on the substrate and defining a pixel area; a thin film transistor connected to the gate line and the data line; a pixel electrode connected to the thin film transistor and formed in the pixel area; a first common electrode formed under the pixel electrode; a second common electrode formed on the pixel electrode, wherein the pixel area includes an upper pixel area and a lower pixel area, the first common electrode is formed in the upper pixel area, the second common electrode is formed in the lower pixel area, and the pixel electrode includes an upper pixel electrode formed in the upper pixel area and a lower pixel electrode formed in the lower pixel area.

Another exemplary embodiment of the present invention provides a thin film transistor array panel having an upper pixel area and a lower pixel area, the thin film transistor including: a substrate; a gate line formed on the substrate; a gate electrode protruding from the gate line; a common electrode line formed in a parallel direction to the gate line; a first common electrode overlapping a portion of the common electrode line and formed in the upper pixel area; a first insulating layer formed on the gate line, the gate electrode, the common electrode line, and the first common electrode; a semiconductor layer corresponding to the gate electrode, formed on the first insulating layer; a data line crossing the gate line; a source electrode and a drain electrode protruding from the data line; a pixel electrode including a lower pixel electrode directly connected to the drain electrode and formed in the lower pixel area, and an upper pixel electrode formed in the upper pixel area; a second insulating layer formed on the source electrode, the drain electrode, and the pixel electrode; and a second common electrode formed in the lower pixel area on the second insulating layer.

Yet another exemplary embodiment of the present invention provides a method for manufacturing a thin film transistor array panel having an upper pixel area and a lower pixel area, the method including: (a) forming a gate line, a common electrode line, and a gate electrode protruding from the gate line, on a substrate; (b) forming a first common electrode overlapping a portion of the common electrode line in the upper pixel area; (c) forming a first insulating layer on the substrate and covering the gate line, the gate electrode, the common electrode line, and the first common electrode; (d) forming a semiconductor layer corresponding to the gate electrode on the first insulating layer; (e) forming a data line across the gate line and forming a source electrode and a drain electrode protruding from the data line and disposed on the semiconductor layer; (f) forming a pixel electrode overlapping a portion of the drain electrode; (g) forming a second insulating layer on the source electrode, the drain electrode, and the pixel electrode; and (h) forming a second common electrode in the lower pixel area and on the second insulating layer, wherein the pixel electrode includes a lower pixel electrode formed in the lower pixel area and an upper pixel electrode formed in the upper pixel area.

According to exemplary embodiments of the present invention, the thin film transistor array panel has reduced power consumption, because dot inversion may be implemented while supplying a data voltage via column inversion.

According to exemplary embodiments of the present invention, it is possible to prevent an afterimage and flicker by driving one pixel, so that it is divided into two pixel areas and the areas have different polarities, by reducing a region on which ion impurities are loaded.

According to exemplary embodiments of the present invention, a difference of voltage occurs between two pixel areas of one pixel, such that visibility is improved.

According to exemplary embodiments of the present invention, even though a distance between pixel electrodes on opposing sides of a data line varies, due to overlay errors that occur during a manufacturing process, there is no capacitance difference between the data line and the pixel electrode.

According to exemplary embodiments of the present invention, since a plurality of thin film transistors protrude in the same direction from the data line, power consumption may be lowered by driving only a column of the corresponding color.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 10A is a process cross-sectional view of the method for manufacturing the thin film transistor array panel, taken along lines Xa-Xa', Xa'-Xa'', Xa''-Xa''' of FIG. 9A.

FIG. 10B is a process cross-sectional view of the method for manufacturing the thin film transistor array panel, taken along Xb-Xb', Xb'-Xb'', Xb''-Xb''' of FIG. 9B.

FIG. 10C is a process cross-sectional view of the method for manufacturing the thin film transistor array panel, taken along lines Xc-Xc', Xc'-Xc'', Xc''-Xc''' of FIG. 9C.

FIG. 10D is a process cross-sectional view of the method for manufacturing the thin film transistor array panel, taken along lines Xd-Xd', Xd'-Xd'', Xd''-Xd''' of FIG. 9D.

FIG. 13 is a view that illustrates polarity of each pixel when a thin film transistor array panel, according to an exemplary embodiment of the present invention, is driven.

DETAILED DESCRIPTION OF THE EXEMPLARY EMBODIMENTS

Figure 1:
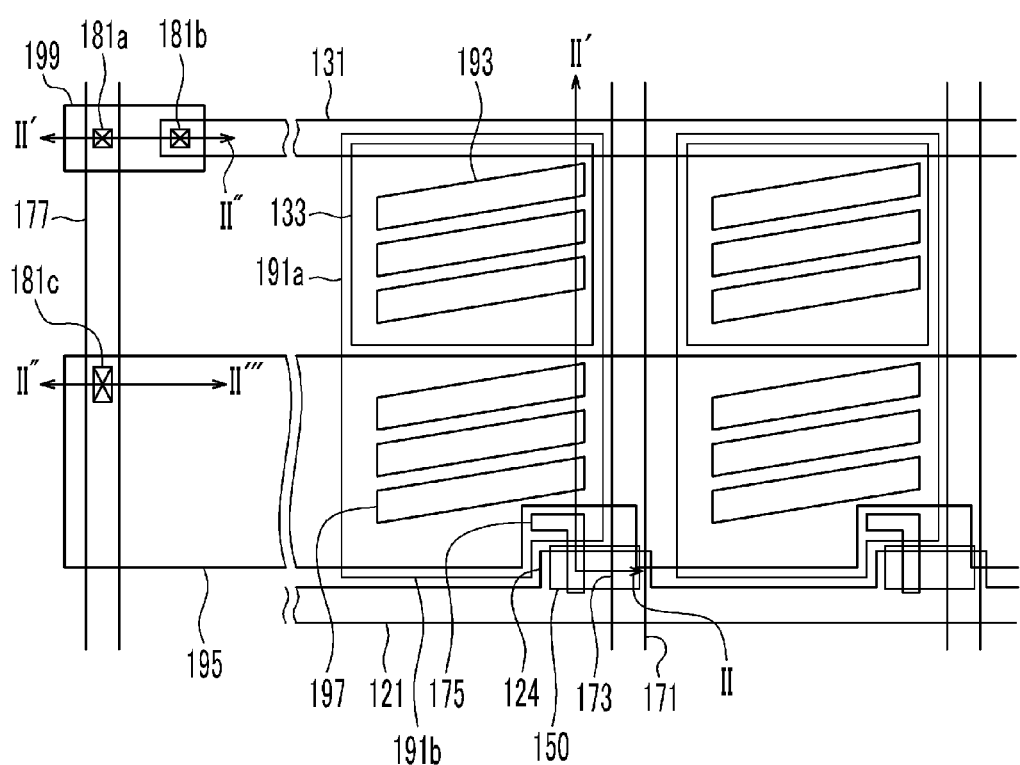
FIG. 1 is a top plan view of a thin film transistor array panel, according to a first exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element, or intervening elements may also be present. In contrast, when an element is referred to as being "directly on" or "directly connected to" another element, there are no intervening elements present.

Figure 2:
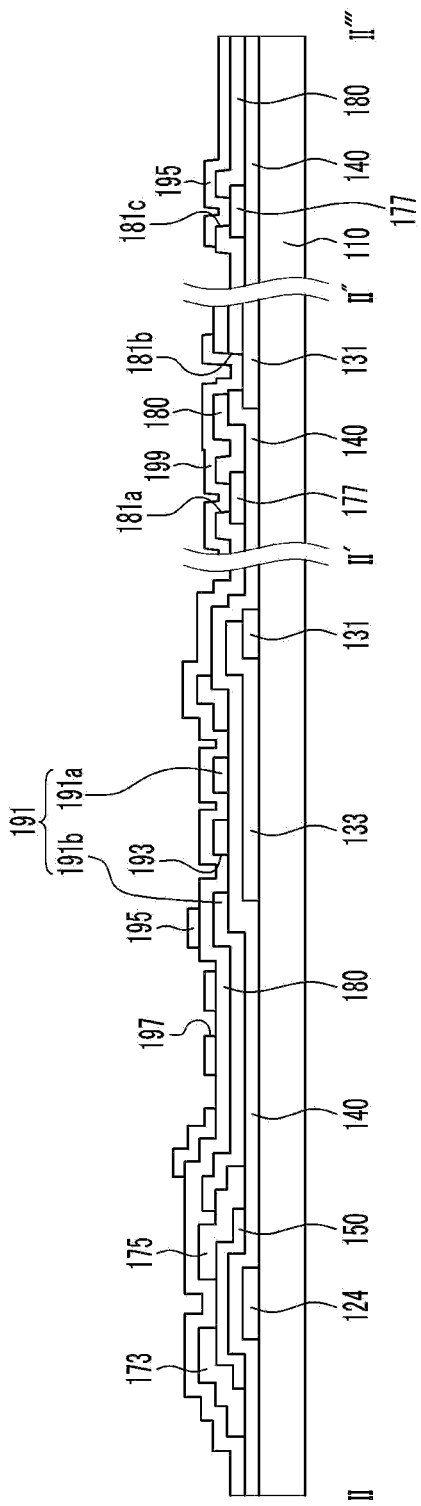
FIG. 2 is a cross-sectional view of the thin film transistor array panel, taken along lines II-II', II'-II'', II''-II''' of FIG. 1.

FIG. 1 is a top plan view of a thin film transistor array panel, according to a first exemplary embodiment of the present invention, and FIG. 2 is a cross-sectional view of the thin film transistor array panel, taken along lines II-II', II'-II''', II'''-II''' of FIG. 1.

The thin film transistor array panel has a pixel area that is divided into an upper pixel area and a lower pixel area. First, a gate line 121 and a gate electrode 124 protruding therefrom are formed on the substrate 110. The substrate 110 can be made of glass or plastic, for example. A common electrode line 131 is formed parallel to the gate line 121. The gate line 121 transmits a gate signal. The common electrode line 131 transmits a common voltage.

A first common electrode 133 is formed in the upper pixel area, so as to overlap a portion of the common electrode line 131. The first common electrode 133 can be made of a transparent electrode material, such as ITO (Indium Tin Oxide) or IZO (Indium Zinc Oxide), for example. The first common electrode 133 receives a voltage from the common electrode line 131, due to overlapping the common electrode line 131 and being directly connected thereto.

A first insulating layer 140 is formed on the surface of the substrate 110, so as to cover the gate line 121, the gate electrode 124, the common electrode line 131, and the first common electrode 133. The first insulating layer 140 may be made of the inorganic insulating material, such as silicon oxide (SiOx) and silicon nitride (SiNx), and may have a thickness in the range of about 3500 Å to 4500 Å.

A semiconductor 150 is formed on the first insulating layer 140. The semiconductor layer 150 is disposed on gate electrode 124. A data line 171, a source electrode 173 that protrudes from the data line 171, and a drain electrode 175 that is apart from the source electrode 173, are formed on the semiconductor layer 150 and the first insulating layer 140.

The data line 171 transmits a data signal and at least partially defines a pixel area, by extending across the gate line 121. In particular, a plurality of the data lines 171 may be formed. Data voltages having opposite polarities are applied to adjacent data lines 171. That is, the voltage is applied in a column inversion format. A data voltage having a first polarity is applied to the data line 171 during one frame, and a data voltage having the opposite polarity is applied during a subsequent frame.

The source electrode 173 protrudes from the data line 171 over the gate electrode 124. The drain electrode 173 is separated from the source electrode 173 on the gate electrode 124. The gate electrode 124, the semiconductor layer 150, the source electrode 173 and the drain electrode 175 form a thin film transistor. The thin film transistor acts as an element that switches the corresponding pixel.

In particular, a plurality of the thin film transistors are formed. The thin film transistors protrude in the same direction with respect to the data line 171. That is, the source electrodes 173 protrude from the data line 171 in the same direction. The pixel electrode 191 made of the transparent electrode material, such as ITO (Indium Tin Oxide) or IZO (Indium Zinc Oxide).

The pixel electrode 191 overlaps a portion of the drain electrode 175. The pixel electrode 191 includes an upper pixel electrode 191a formed in the upper pixel area and a lower pixel electrode 191b formed in the lower pixel area. The upper pixel electrode 191a and the lower pixel electrode 191b may be integrally formed. The upper pixel electrode 191a includes one or more openings (through holes) 193 that extend lengthwise, in parallel to the long axis of the gate line 121.

A second insulating layer 180 is formed on the data line 171, the source electrode 173, the drain electrode 175, and the pixel electrode 191. The second insulating layer 180 may be made of the inorganic insulating material, such as silicon oxide (SiOx) and silicon nitride (SiNx), and may have a thickness in the range of about 500 Å to 2500 Å.

A second common electrode 195 made of the transparent electrode material is is formed in the lower pixel area, on the second insulating layer 180. The second common electrode 195 is generally rectangular and extends across the lower pixel areas. Portions of the second common electrode 195 are omitted, such that the second common electrode 195 does not cover the thin film transistors. The second common electrode 195 includes openings (through holes) 197 that extend in parallel, lengthwise, toward the data line 171.

The first common electrode 133 is covered by the upper pixel electrode 191a and extends entirely across the openings 193 thereof. The lower pixel electrode 191b covers the second common electrode 195 and extends entirely across the openings 197 thereof.

In the upper pixel area of the thin film transistor array panel, an electric field is formed between the first common electrode 133 and the upper pixel electrode 191a. In the lower pixel area, an electric field is formed between the second common electrode 195 and the lower pixel electrode 191b. The first common electrode 133 and the second common electrode 195 are applied with the same common voltage, and the upper pixel electrode 191a and lower pixel electrode 191b are applied with the same data voltage. In this case, the electric field formed between the first common electrode 133 and the upper pixel electrode 191a has an opposite polarity to the electric field formed between the second common electrode 195 and the lower pixel electrode 191b.

The thin film transistor array panel may further include a common voltage supply line 177 that is formed at the edge of the substrate 110. The common voltage supply line 177 may be formed of the same material as and on the same layer as the data line 171.

A first contact hole 181a may be formed in the second insulating layer 180, such that a portion of the common voltage supply line 177 is exposed. A second contact hole 181b may be formed in the first insulating layer 140 and the second insulating layer 180, such that a portion of the common electrode line 131 is exposed. A connection electrode 199 is formed that is connected to the common voltage supply line 177 through the first contact hole 181a and is connected to the common electrode line 131 through the second contact hole 181b. That is, the connection electrode 199 connects the common voltage supply line 177 and the common electrode line 131 to each other, such that a common voltage is supplied from the common voltage supply line 177 to the common electrode line 131. In this case, the connection electrode 199 may be formed of the same material as and on the same layer as the second common electrode 195.

A third contact hole 181c may be formed in the second insulating layer 180, such that a portion of the common voltage supply line 177 is exposed. The second common electrode 195 overlaps the common voltage supply line 177, is connected to the common voltage supply line 177 through the third contact hole 181c, and is supplied with the common voltage from the common voltage supply line 177. Since the common voltage supply line 177 is connected to the first common electrode 133 that is connected to the common electrode line 131 and is connected to the second common electrode 195, the first common electrode 133 and the second common electrode 195 are supplied with the same common voltage.

Figure 3:
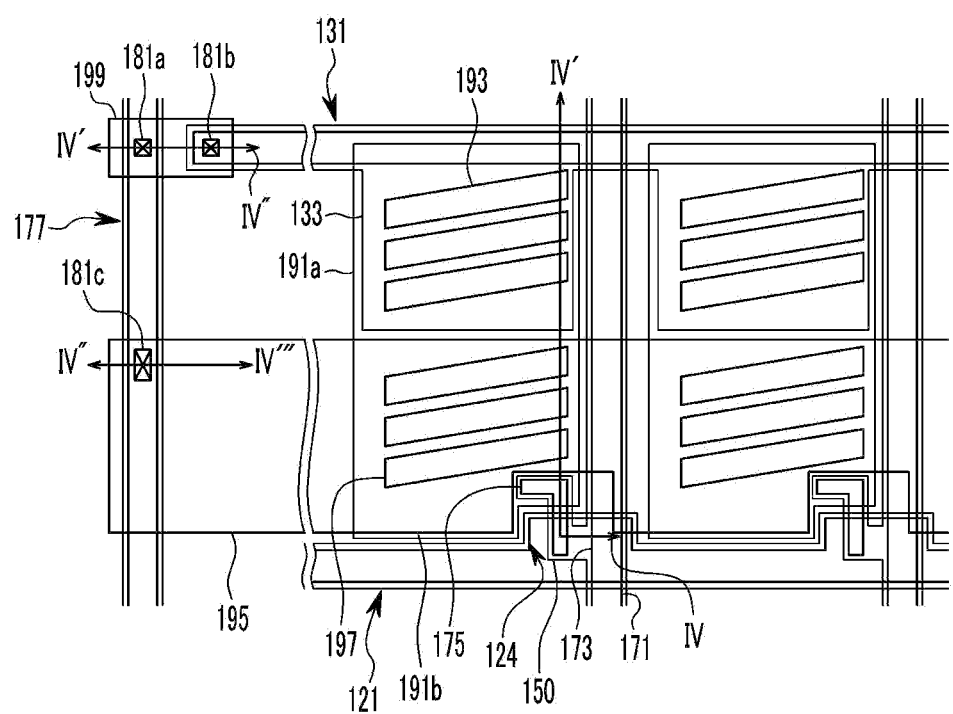
FIG. 3 is a top plan view of a thin film transistor array panel, according to a second exemplary embodiment of the present invention.
Figure 4:
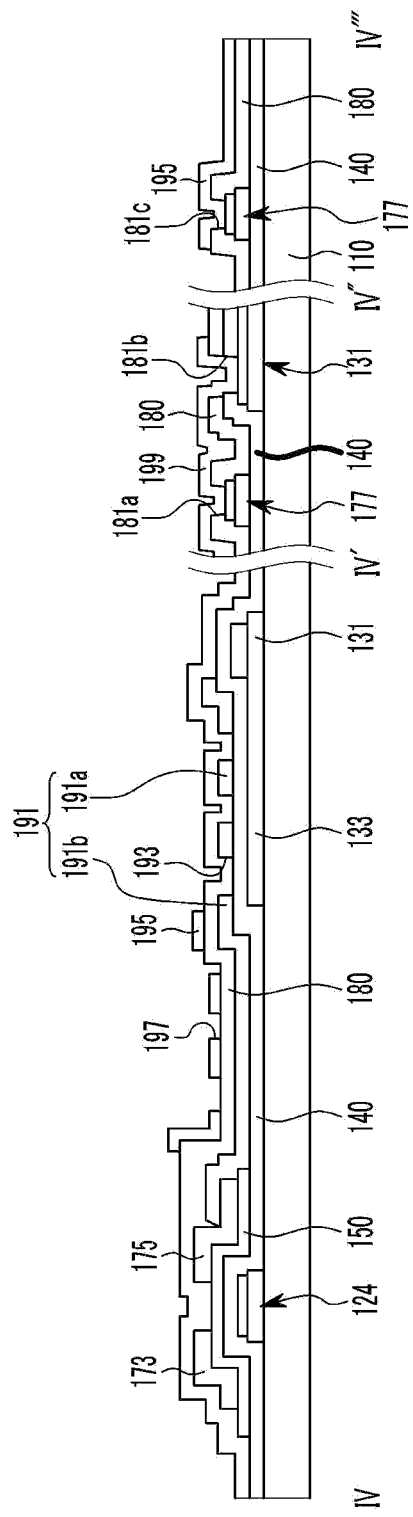
FIG. 4 is a cross-sectional view of the thin film transistor array panel, taken along lines IV-IV', IV'-IV'', IV''-IV''' of FIG. 3.

FIG. 3 is a top plan view of a thin film transistor array panel, according to a second exemplary embodiment of the present invention. FIG. 4 is a cross-sectional view of the thin film transistor array panel, taken along lines IV-IV', IV'-IV", IV"-IV'" of FIG. 3.

The thin film transistor array panel according to the second exemplary embodiment of the present invention has a similar structure to the thin film transistor array panel according to the first exemplary embodiment. Thus, only the differences there between will be described in detail.

The thin film transistor array panel according to the second exemplary embodiment is similar to the first exemplary embodiment, in that the common electrode line 131 and the first common electrode 133 overlap each other. However, in the first exemplary embodiment, the first common electrode 133 is formed on the common electrode line 131, while in the second exemplary embodiment the common electrode line 131, gate line 121, and gate electrode 124 are formed on the first common electrode 133.

In addition, the first common electrode 133 does not overlap only a portion of the common electrode line 131. Instead, the first common electrode 133 completely overlaps the portions of the common electrode line 131, gate line 121, and gate electrode 124. In this case, the first common electrode 133, common electrode line 131, gate line 121, and gate electrode 124 are formed using one mask.

In the first exemplary embodiment, the semiconductor layer 150 is formed below and between the source electrode 173 and the drain electrode 175. In the second exemplary embodiment, the semiconductor layer 150 is formed below and between the source electrode 173 and the drain electrode 175, and below the data line 171. In this case, the semiconductor layer 150, data line 171, source electrode 173, and drain electrode 175 are formed using one mask.

Figure 5:
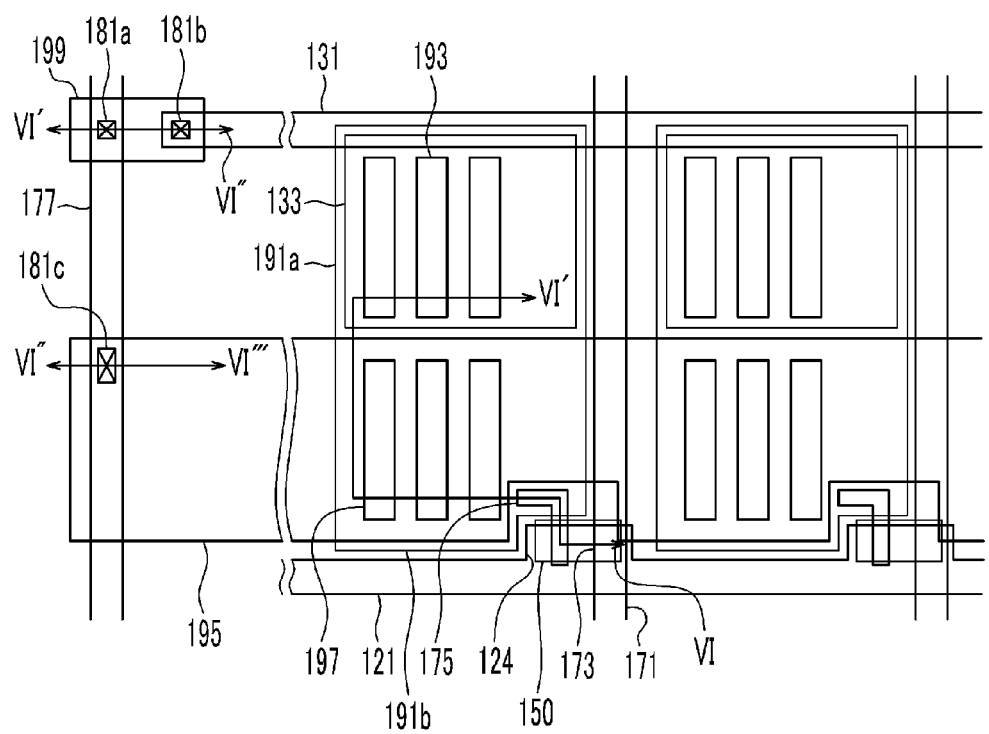
FIG. 5 is a top plan view of a thin film transistor array panel, according to a third exemplary embodiment of the present invention.
Figure 6:
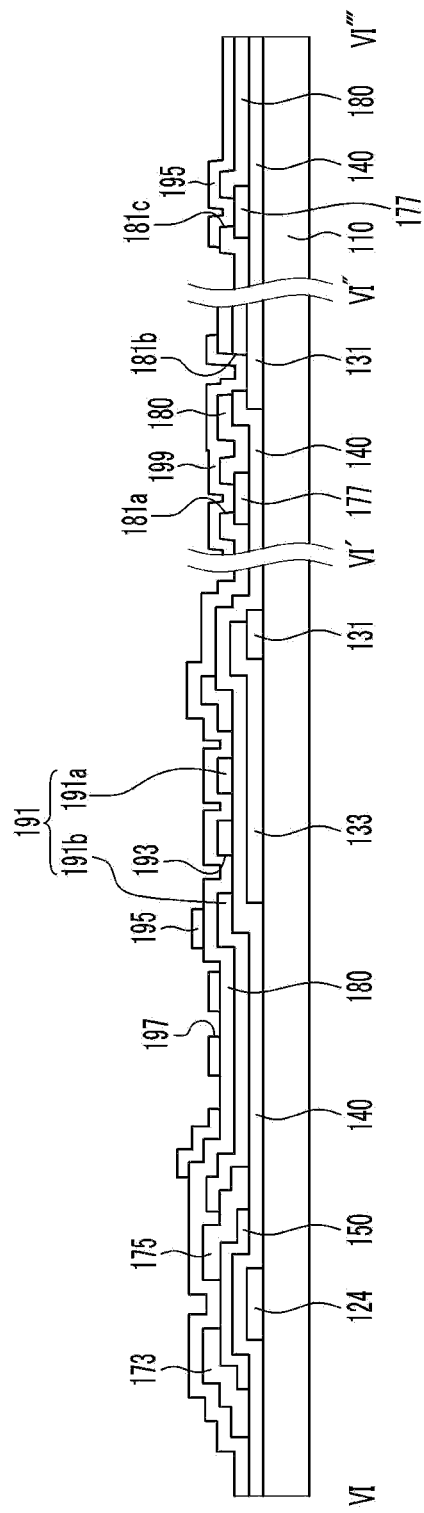
FIG. 6 is a cross-sectional view of the thin film transistor array panel, taken along the lines VI-VI', VI'-VI'', VI''-VI''' of FIG. 5.

FIG. 5 is a top plan view of a thin film transistor array panel according to a third exemplary embodiment of the present invention. FIG. 6 is a cross-sectional view of the thin film transistor array panel, taken along lines VI-VI', VI'-VI", VI"-VI'" of FIG. 5.

The thin film transistor array panel according to the third exemplary embodiment of the present invention is similar to the thin film transistor array panel according to the first exemplary embodiment. Thus, only the differences there between will be described in detail.

In the first exemplary embodiment, the upper pixel electrode 191a and the second common electrode 195 include the openings 193 and 197 that extend lengthwise, in a direction parallel to the long axis of the data line 171. On the other hand, in the third exemplary embodiment, the openings 193 and 197 of the upper pixel electrode 191a and the second common electrode 195 extend lengthwise, in a direction parallel to the long axis of the data line 171.

According to some embodiments, the openings 193 and 197 may extend in a direction parallel to the long axis of the gate line 121 or the long axis of the data line 171. However, according to other embodiments, the openings 193 and 197 may extend in a direction that is substantially parallel to (slightly offset from) the long axis of the gate line 121 or the long axis of the data line 171. In addition, the openings 193 and 197 are shown in the drawings as being quadrilateral, but the shape of the openings 193 and 197 is not limited thereto, and may be various shapes, such as ovoid.

Figure 7:
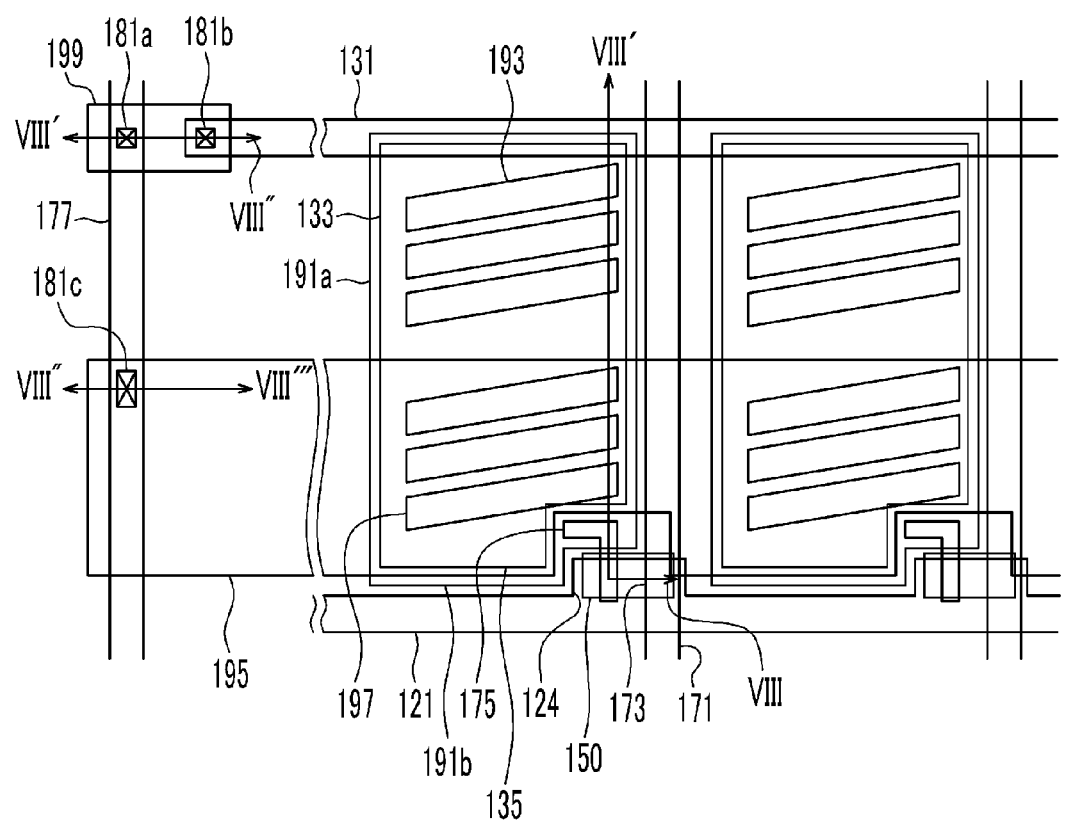
FIG. 7 is a top plan view of a thin film transistor array panel, according to a fourth exemplary embodiment of the present invention.
Figure 8:
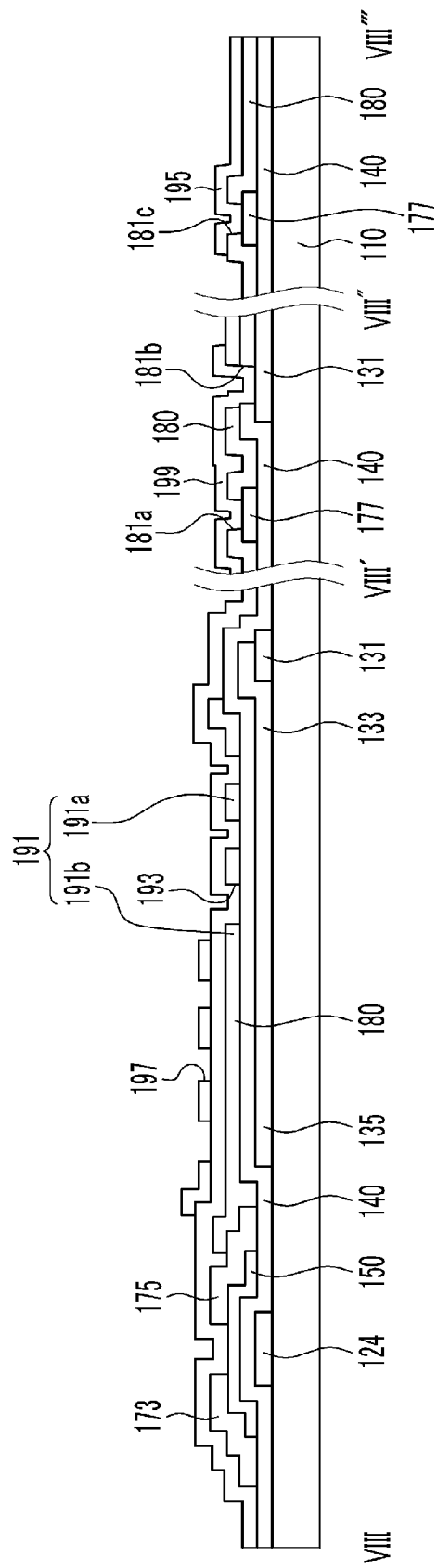
FIG. 8 is a cross-sectional view of the thin film transistor array panel, taken along the lines VIII-VIII', VIII'-VIII'', VIII''-VIII''' of FIG. 7.

FIG. 7 is a top plan view of a thin film transistor array panel according to a fourth exemplary embodiment of the present invention. FIG. 8 is a cross-sectional view of the thin film transistor array panel, taken along the lines VIII-VIII', VIII'-VIII", VIII"-VIII'" of FIG. 7.

The thin film transistor array panel according to the fourth exemplary embodiment is similar to the thin film transistor array panel according to the first exemplary embodiment. Thus, only the differences there between will be described in detail.

The thin film transistor array panel according to the fourth exemplary embodiment includes a storage electrode 135 that is connected to the first common electrode 133 and is disposed in the lower pixel area. The first common electrode 133 and the storage electrode 135 may be integrally formed, so as to cover the entire lower pixel area.

The storage electrode 135 is formed in the upper pixel area, on the same layer as the first common electrode 133, and may be formed without a separate additional process. When the thin film transistor array panel is applied to a liquid crystal display having high resolution, problems resulting from insufficient storage capacitance can be overcome.

Figure 9A:
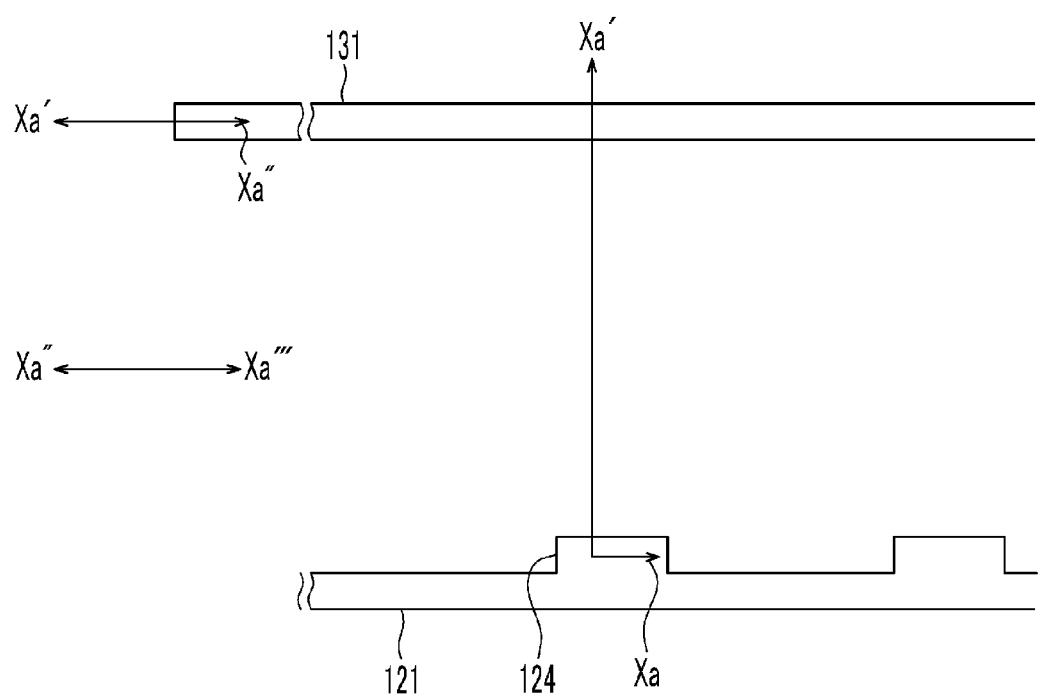
FIGS. 9A, 9B, 9C, 9D, 9E, and 9F are process top plan views of a method for manufacturing the thin film transistor array panel according to the first exemplary embodiment of the present invention.
Figure 9B:
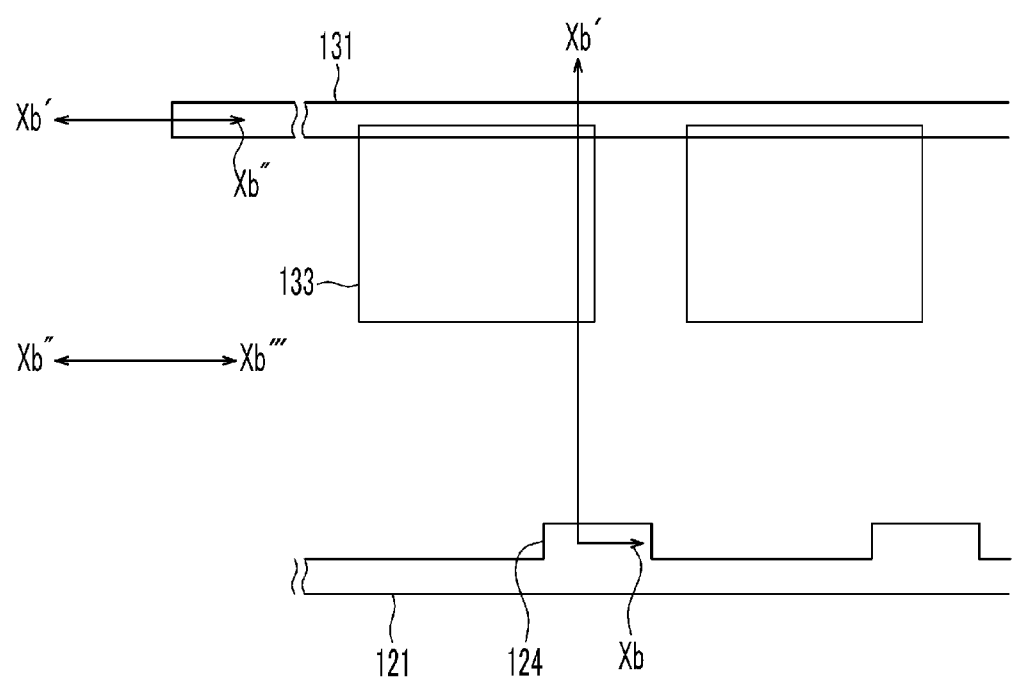
Figure 9C:
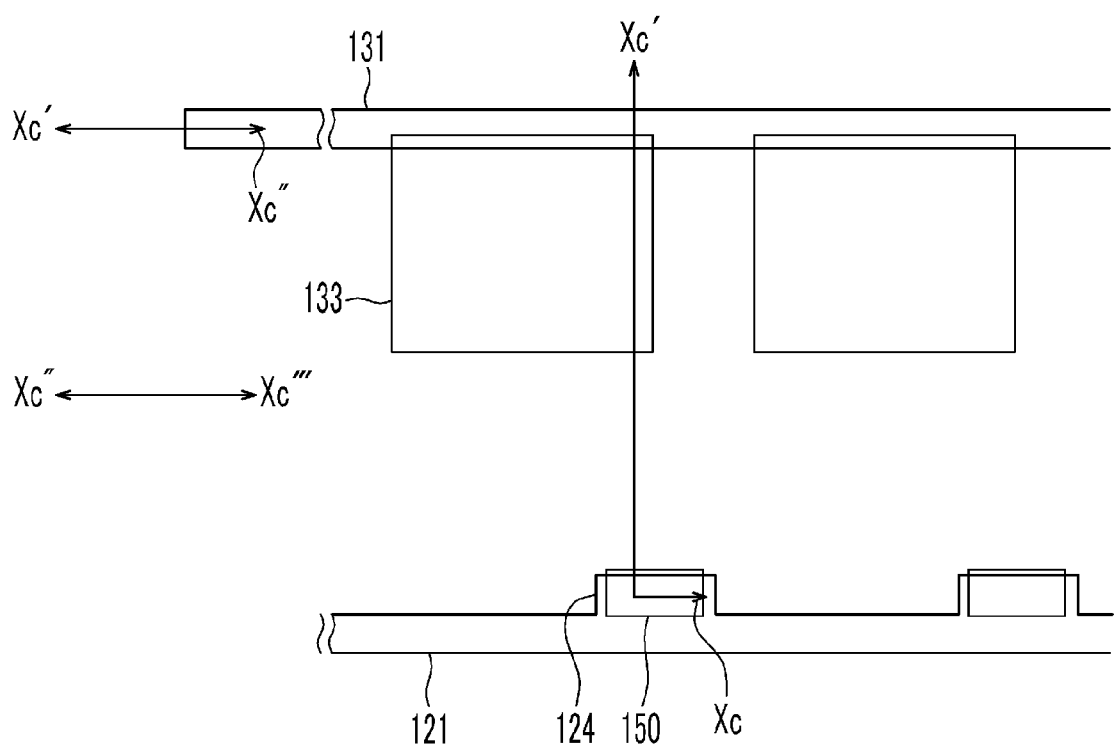
Figure 9D:
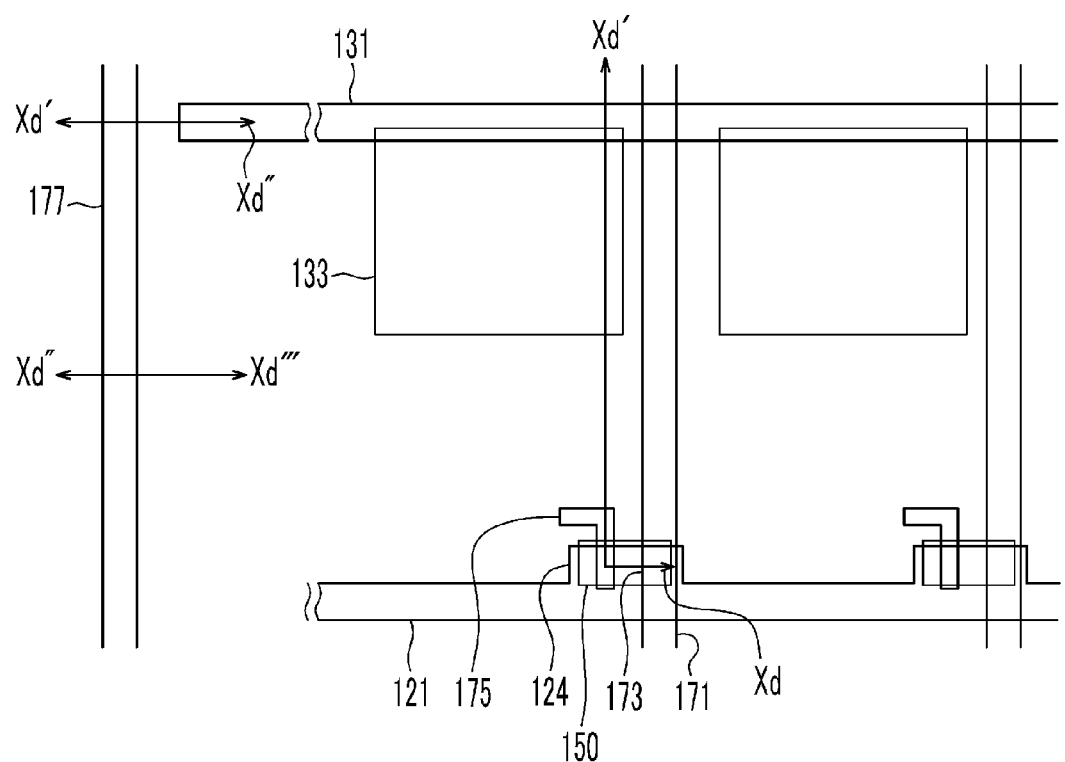
Figure 9E:
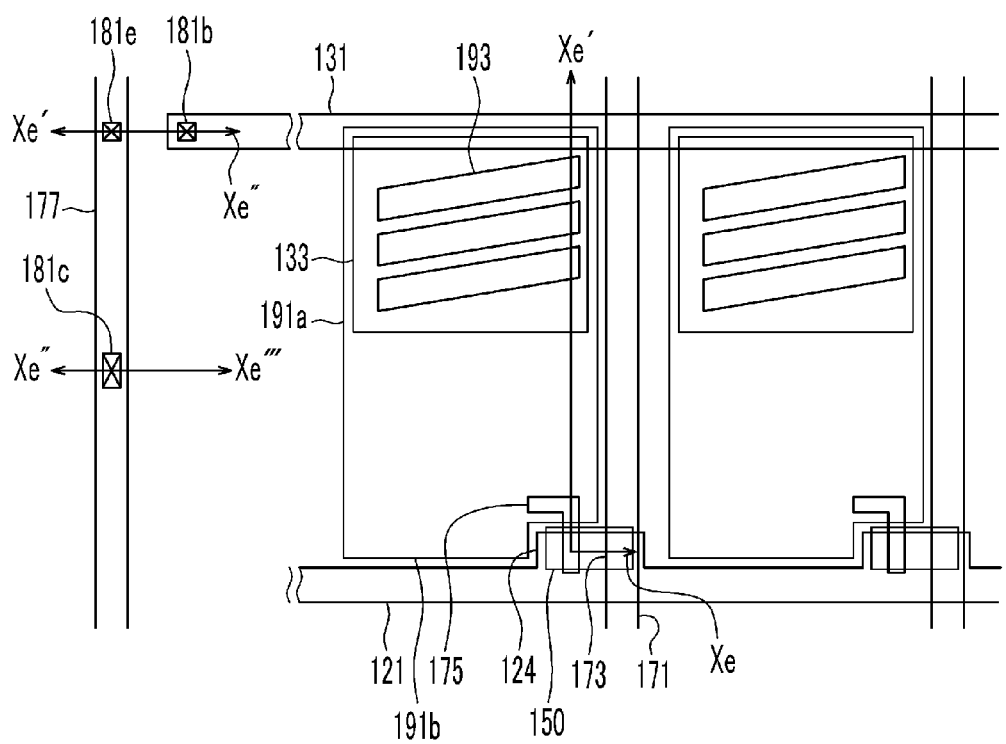

FIGS. 9A to 9F are top plan views of a process of forming the thin film transistor array panel according to the first exemplary embodiment of the present invention. FIG. 10A is a cross-sectional view taken along the lines Xa-Xa', Xa'-Xa", Xa"-Xa'" of FIG. 9A, and FIG. 10B is a process cross-sectional view taken along lines Xb-Xb', Xb'-Xb", Xb"-X'" of FIG. 9B. FIG. 10C is a cross-sectional view taken along the lines Xc-Xc', Xc'-Xc", Xc'-Xc'" of FIG. 9C, FIG. 10D is a cross-sectional view taken along the lines Xd-Xd', Xd'-Xd", Xd"-Xd'" of FIG. 9D, FIG. 10E is a cross-sectional view taken along the lines Xe-Xe', Xe'-Xe", Xe"-Xe'" of FIG. 9E, and FIG. 10F is a cross-sectional view taken along the lines Xf-Xf', Xf'-Xf", Xf"-Xf'" of FIG. 9F.

The thin film transistor array panel, according to the first exemplary embodiment of the present invention, includes the pixel area 191 divided into the upper pixel 191a area and the lower pixel area 191b. First, as shown in FIG. 9A and FIG. 10A, a common electrode line 131, a gate line 121, and a gate electrode 124 protruding from the gate line 121 are formed of a conductive material, on the substrate 110. The common electrode line 131 and the gate line 121 may be formed to extend in parallel.

As shown in FIG. 9B and FIG. 10B, a first common electrode 133 is formed in the upper pixel area, so as to overlap a portion of the common electrode line 131. The first common electrode 133 receives a voltage by overlapping the common electrode line 131 and being directly connected thereto.

A storage electrode 135 may further be formed in the lower pixel area, so as to be connected with the first common electrode 133. The first common electrode 133 and storage electrode 135 may be integrally formed, so as to completely cover a portion of the pixel area. The storage electrode 135 is formed in the upper pixel area, on the same layer as the first common electrode 133, and may be formed without a separate additional process. When the thin film transistor array panel is applied to the liquid crystal display having high resolution, the insufficiency of a storage capacitance can be overcome.

Next, a first insulating layer 140 is formed to cover the substrate 110, the gate line 121, the gate electrode 124, the common electrode line 131, and the first common electrode 133. The first insulating layer 140 may be made of the inorganic insulating material and may have a thickness in the range of about 3500 Å to 4500 Å.

As shown in FIG. 9C and FIG. 10C, a semiconductor layer 150 is formed on the first insulating layer 140. The semiconductor layer 150 is disposed on the gate electrode 124. As shown in FIG. 9D and FIG. 10D, a data line 171, a source electrode 173, and a drain electrode 175 are formed on the semiconductor layer 150 and the first insulating layer 140.

The data line 171 at least partially defines a pixel area, by extending across the gate line 121. A plurality of the data lines 171 are formed, and data voltages having opposite polarities are applied to adjacent data lines 171. That is, the voltages are applied in column inversion format. A data voltage having a first polarity is applied to the data line 171 for one frame, and a data voltage having the opposite polarity is applied for a subsequent frame.

The source electrode 173 protrudes from the data line 171 and extends over the gate electrode 124. The drain electrode 175 is separated from the source electrode 173 on the gate electrode 124. The gate electrode 124, semiconductor layer 150, source electrode 173, and drain electrode 175 form a thin film transistor.

The array panel includes a plurality of the thin film transistors. The thin film transistors extend in the same direction with respect to the data line 171. That is, the source electrodes 173 protrude from the data line 171 in the same direction. During the formation of the data line 171, a source electrode 173, a drain electrode 175, a common voltage supply line 177 may also be formed at an edge of the substrate 110, using the same type of material.

As shown in FIG. 9E and FIG. 10E, a transparent pixel electrode 191 is formed, so as to overlap a portion of the drain electrode 175. The pixel electrode 191 includes an upper pixel electrode 191a formed in the upper pixel area and a lower pixel electrode 191b formed in the lower pixel area. The upper pixel electrode 191a and the lower pixel electrode 191b may be integrally formed. The upper pixel electrode 191a may include one or more openings 193 that extend lengthwise, in a direction parallel to the long axis of the data line 171.

A second insulating layer 180 is formed on the data line 171, the source electrode 173, the drain electrode 175, and the pixel electrode 191. The second insulating layer 180 may be made of the inorganic insulating material, and may have a thickness in the range of about 500 Å to 2500 Å.

Next, a first contact hole 181a may be formed in the second insulating layer 180, such that a portion of the common voltage supply line 177 is exposed. A second contact hole 181a may be formed in the first insulating layer 140 and the second insulating layer 180, such that a portion of the common electrode line 131 is exposed. In addition, a third contact hole 181c may be formed in the second insulating layer 180, such that a portion of the common voltage supply line 177 is exposed.

Figure 9F:
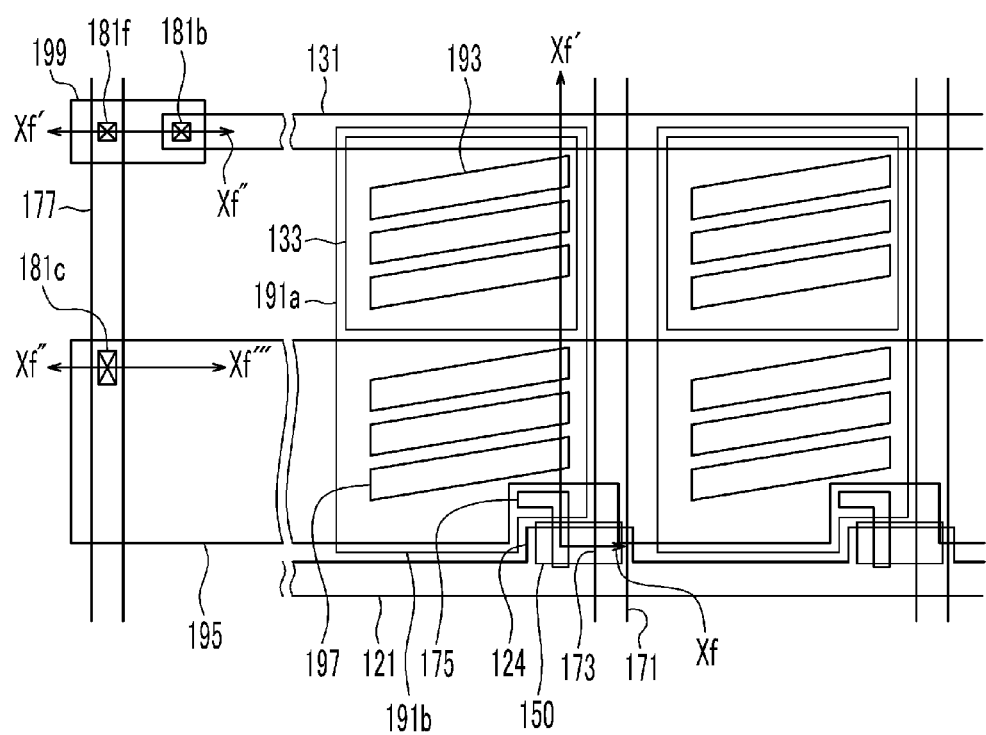
Figure 10E:
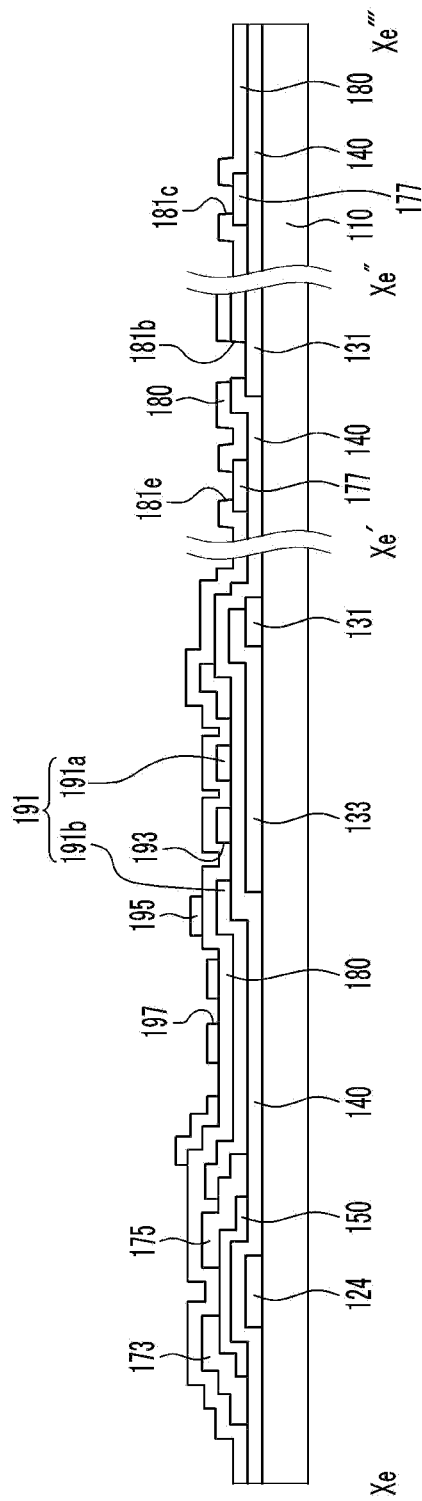
FIG. 10E is a process cross-sectional view of the method for manufacturing the thin film transistor array panel, taken along Xe-Xe', Xe'-Xe'', Xe''-Xe''' of FIG. 9E.
Figure 10F:
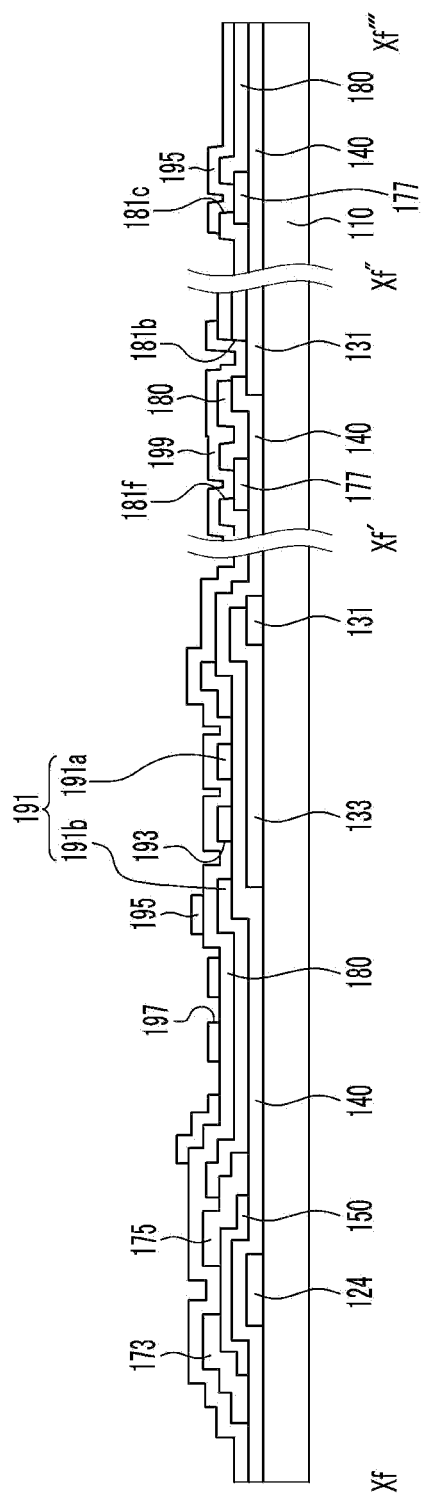
FIG. 10F is a process cross-sectional view of the method for manufacturing the thin film transistor array panel, taken along lines Xf-Xf', Xf'-Xf'', Xf''-Xf''' of FIG. 9F.

As shown in FIG. 9F and FIG. 10F, a transparent second common electrode 195 is formed in the lower pixel area, on the second insulating layer 180. The second common electrode 195 may include one or more openings 197 that extend lengthwise, parallel to the long axis of the data line 171.

During the formation of the second common electrode 195, a connection electrode 199 may also be formed, of the same type of material. The connection electrode 199 is connected to the common voltage supply line 177 through the first contact hole 181a and is connected to the common electrode line 131 through the second contact hole 181b. That is, the connection electrode 199 connects the common voltage supply line 177 and the common electrode line 131 to each other, such that a common voltage is supplied from the common voltage supply line 177 to the common electrode line 131.

The second common electrode 195 extends so that it overlaps the common voltage supply line 177 and is connected to the common voltage supply line 177 through the third contact hole 181c. That is, the second common electrode 195 is supplied with a common voltage from the common voltage supply line 177. Therefore, the common voltage supply line 177 is connected to the first common electrode 133, which is connected to the common electrode line 131, and is connected to the second common electrode 195. Thus, the first common electrode 133 and the second common electrode 195 are supplied with the same common voltage.

In the upper pixel area of the thin film transistor array panel an electric field is formed between the first common electrode 133 and the upper pixel electrode 191a. In the lower pixel area, an electric field is formed between the second common electrode 195 and the lower pixel electrode 191b. The first common electrode 133 and the second common electrode 195 are applied with the same common voltage, and the upper pixel electrode 191a and the lower pixel electrode 191b are applied with the same data voltage. In this case, an electric field formed between the first common electrode 133 and the upper pixel electrode 191a has an opposite polarity to the electric field formed between the second common electrode 195 and the lower pixel electrode 191b.

In the method for manufacturing the thin film transistor array panel, the upper pixel electrode 191a and the second common electrode 195 have openings 193 and 197 that extend lengthwise, in a direction parallel to the long axis of the data line 171. However, according to some embodiments, the openings 193 and 197 may extend in a direction parallel to the long axis of the gate line 121.

According to some embodiments, the openings 193 and 197 may extend in parallel toward the data line 171, but may extend at a slight angle, with respect to the gate line 121. In other words, the openings 193 and 197 may extend in a direction that is substantially parallel to the long axis of the gate line 121 or the long axis of the data line 171.

Figure 11A:
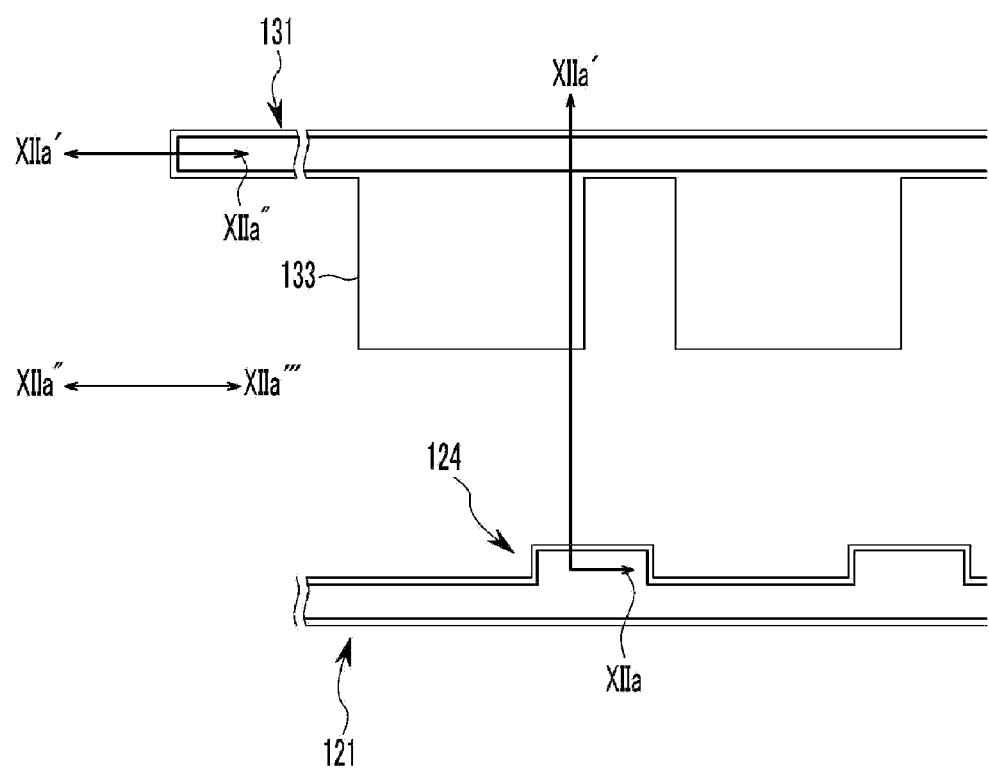
FIGS. 11A, 11B, 11C, and 11D are process top plan views of the method for manufacturing the thin film transistor array panel according to the second exemplary embodiment of the present invention.
Figure 11B:
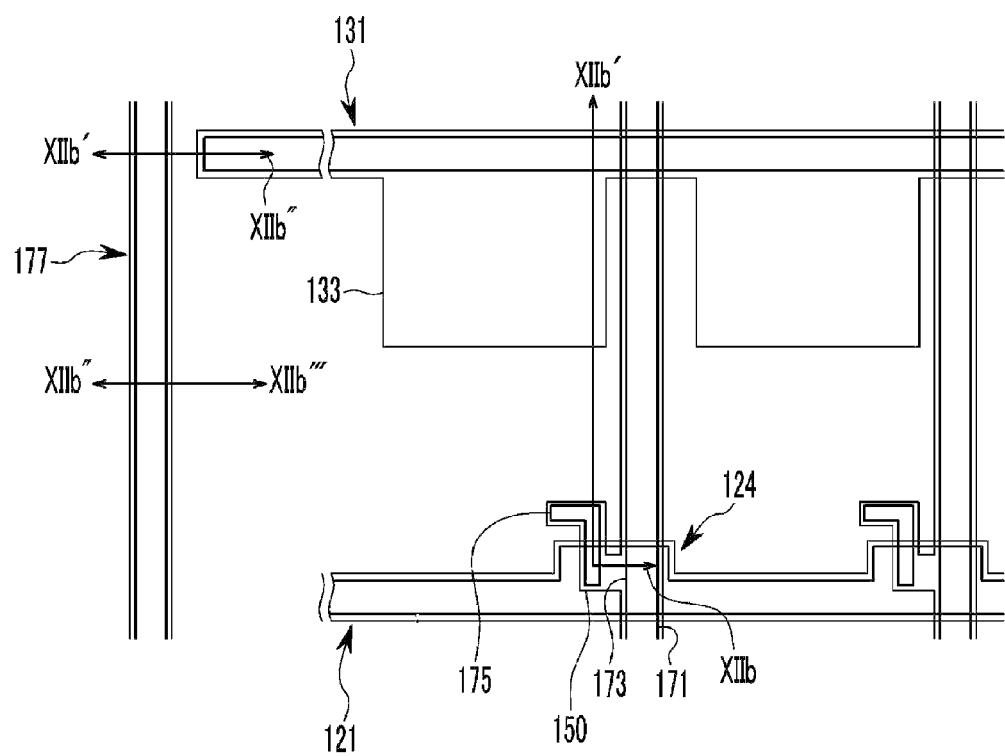
Figure 11C:
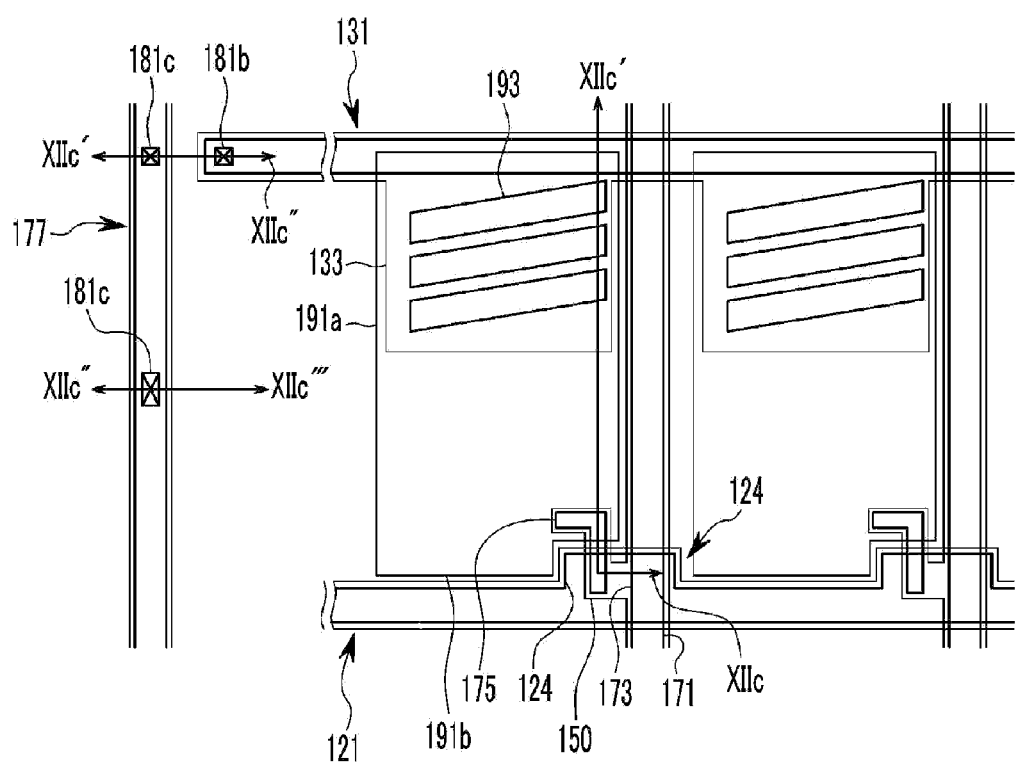

FIGS. 11A to 11D are top plan views of a method of forming the thin film transistor array panel according to the second exemplary embodiment of the present invention. FIG. 12A is a cross-sectional view taken along lines XIIa-XIIa', XIIa'-XIIa'', XIIa''-XIIa''' of FIG. 11A, and FIG. 12B is a cross-sectional view taken along lines XIIb-XIIb', XIIb'-XIIb'', XIIb''-XIIb''' of FIG. 11B. FIG. 12C is a cross-sectional view taken along lines XIIc-XIIc', XIIc'-XIIc'', XIIc''-XIIc''' of FIG. 11C, and FIG. 12D is a cross-sectional view taken along the lines XIId-XIId', XIId'-XIId'', XIId''-XIId''' of FIG. 11D.

As shown in FIG. 11A and FIG. 12A, the first common electrode 133 is formed in the upper pixel area on the substrate 110, and the common electrode line 131, the gate line 121, and the gate electrode 124 overlap the first common electrode 133.

The first common electrode 133 is formed of the transparent electrode material. The common electrode line 131, gate line 121, and gate electrode 124 may be formed of the conductive material. The common electrode line 131 and the gate line 121 may be formed to extend in parallel.

The first common electrode 133, common electrode line 131, gate line 121, and gate electrode 124 are formed using one mask. The first common electrode 133, common electrode line 131, gate line 121, and gate electrode 124 may be formed by sequentially stacking a transparent electrode material and a conductive material, on the entire surface of the substrate 110 and then patterning the material using a slit mask or half tone mask.

Next, a first insulating layer 140 is formed on the substrate 110, so as to cover the first common electrode 133, common electrode line 131, gate line 121, and gate electrode 124. The first insulating layer 140 may be made of the inorganic insulating material, and may have a thickness in the range of about 3500 Å to 4500 Å.

As shown in FIG. 11B and FIG. 12B, the semiconductor layer 150 is formed on the first insulating layer 140. A data line 171, a source electrode 173, and a drain electrode 175 are formed on the semiconductor layer 150.

The semiconductor layer 150, data line 171, source electrode 173 and drain electrode 175 are formed by using one mask. In this case, the mask may be a slit mask or half tone mask.

The semiconductor layer 150 is formed on the gate electrode 124 and under the data line 171. The data line 171 at least partially defines a pixel area, by extending across the gate line 121.

The source electrode 173 protrudes from the data line 171 over the gate electrode 124. The drain electrode 175 is separated from the source electrode 173 on the gate electrode 124. The gate electrode 124, semiconductor layer 150, source electrode 173, and drain electrode 175 form a thin film transistor.

The thin film transistor array panel may include plurality of the thin film transistors. The thin film transistors extend in the same direction with respect to the data line 171. That is, the source electrodes 173 protrude from the data line 171 in the same direction. When forming the data line 171, source electrode 173, and drain electrode 175, a common voltage supply line 177 may be further formed at an edge of the substrate 110, using the same type of material.

As shown in FIG. 11C and FIG. 12C, a transparent pixel electrode 191 is formed, so as to overlap a portion of the common electrode line 175. The pixel electrode 191 includes an upper pixel electrode 191a formed in the upper pixel area and a lower pixel electrode 191b formed in the lower pixel area. The upper pixel electrode 191a and the lower pixel electrode 191b may be integrally formed. The upper pixel electrode 191a may include openings 193 that extend lengthwise, in parallel to the long axis of the data line 171.

A second insulating layer 180 is formed on the data line 171, the source electrode 173, the drain electrode 175, and the pixel electrode 191. The second insulating layer 180 may be made of the inorganic insulating material, and may have a thickness in the range of about 500 Å to 2500 Å.

A first contact hole 181a may be formed in the second insulating layer 180, so as to expose a portion of the common voltage supply line 177, and a second contact hole 181b may be formed in the first insulating layer 140 and the second insulating layer 180, so as to expose a portion of the common electrode line 131. In addition, a third contact hole 181c may be formed in the second insulating layer 180, so as to expose a portion of the common voltage supply line 177.

Figure 11D:
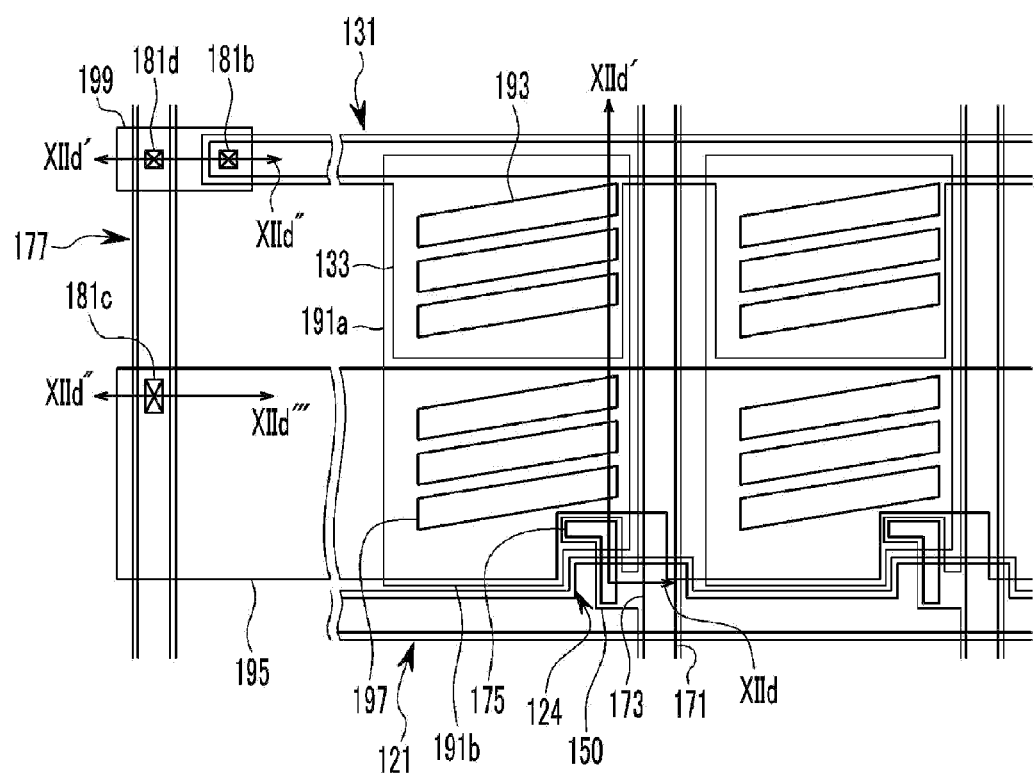
Figure 12A:
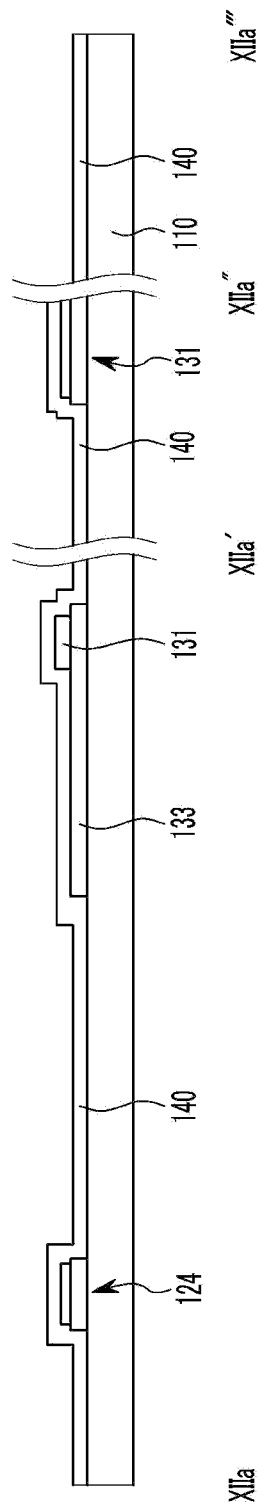
FIG. 12A is a process cross-sectional view of the method for manufacturing the thin film transistor array panel, taken along lines XIIa-XIIa', XIIa'-XIIa'', XIIa''-XIIa''' of FIG. 11A.
Figure 12B:
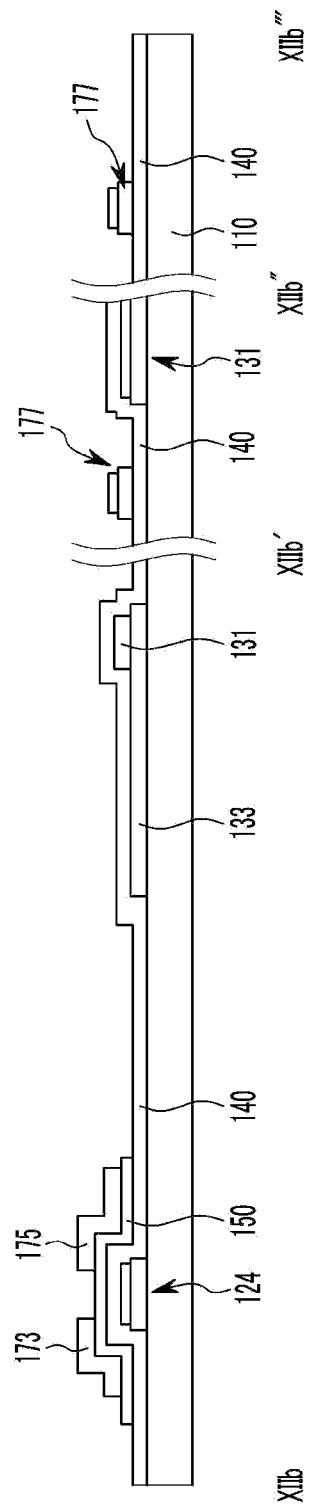
FIG. 12B is a process cross-sectional view of the method for manufacturing the thin film transistor array panel, taken along lines XIIb-XIIb', XIIb'-XIIb'', XIIb''-XIIb''' of FIG. 11B.
Figure 12C:
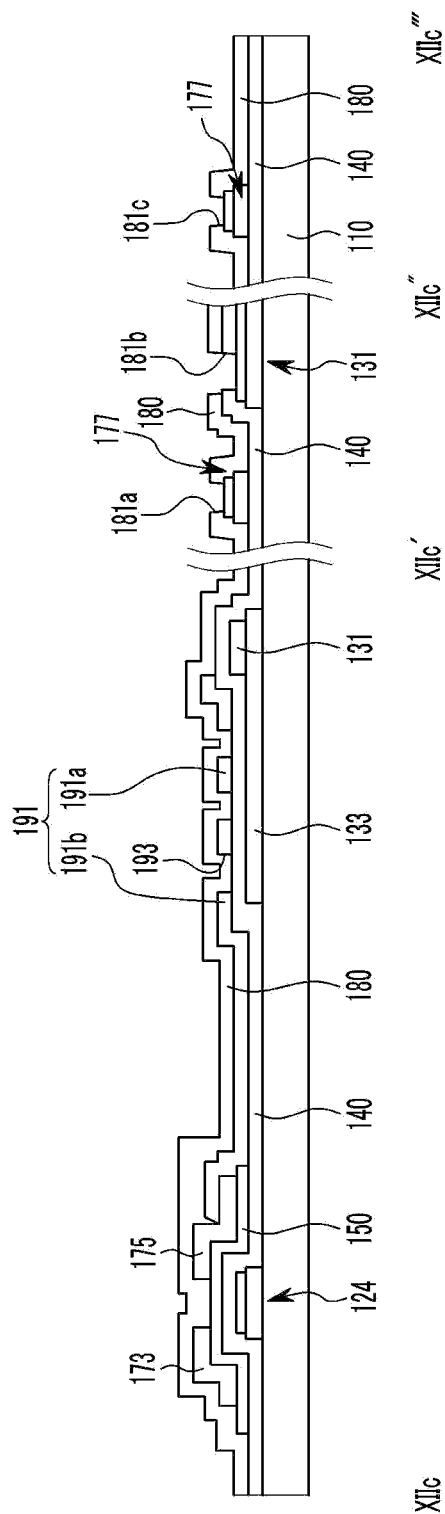
FIG. 12C is a process cross-sectional view of the method for manufacturing the thin film transistor array panel, taken along lines XIIc-XIIc', XIIc'-XIIc'', XIIc''-XIIc''' of FIG. 11C.
Figure 12D:
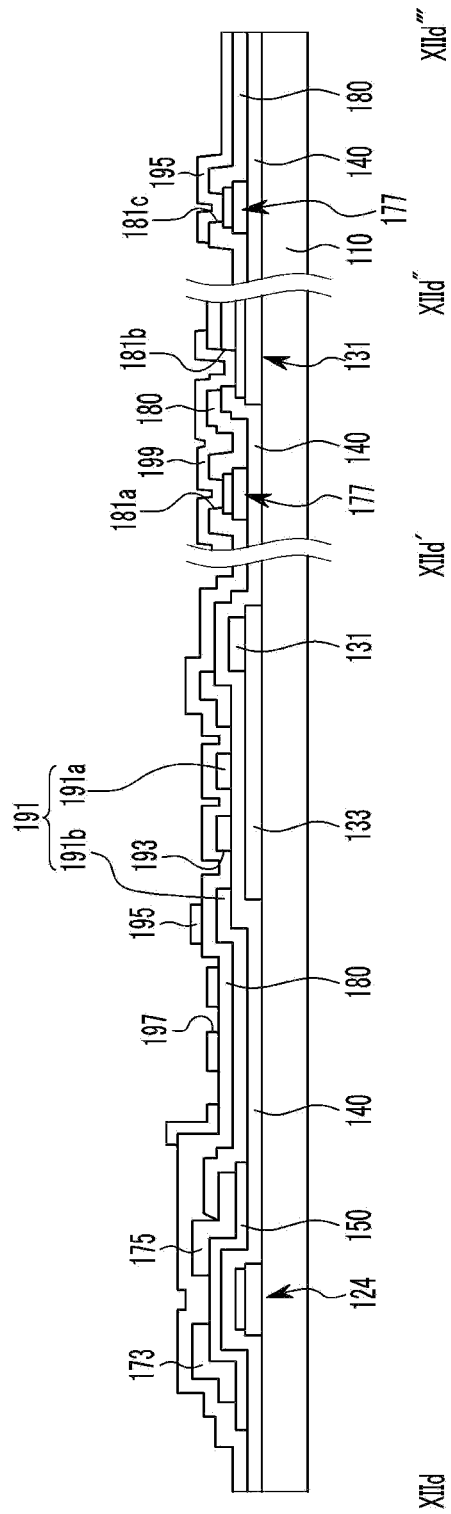
FIG. 12D is a process cross-sectional view of the method for manufacturing the thin film transistor array panel, taken along lines XIId-XIId', XIId'-XIId'', XIId''-XIId''' of FIG. 11D.

As shown in FIG. 11D and FIG. 12D, a transparent second common electrode 195 is formed in the lower pixel area on the second insulating layer 180. The second common electrode 195 may extend between and completely cover the lower pixel areas, except for portions where the thin film transistor are formed. The second common electrode 195 may include one or more openings 197 that extend lengthwise, in parallel to the data line 171.

During the formation of the second common electrode 195, a connection electrode 199 may also be formed of the same type of material. The connection electrode 199 is connected to the common voltage supply line 177 through the first contact hole 181a and is connected to the common electrode line 131 through the second contact hole 181b. That is, the connection electrode 199 connects the common voltage supply line 177 and the common electrode line 131 to each other, such that a common voltage is supplied from the common voltage supply line 177 to the common electrode line 131.

The second common electrode 195 overlaps the common voltage supply line 177 and is connected to the common voltage supply line 177 through the third contact hole 181c. That is, the second common electrode 195 is supplied with a common voltage from the common voltage supply line 177.

The common voltage supply line 177 is connected to the first common electrode 133, which is connected to the common electrode line 131, and is connected to the second common electrode 195. As such, the first common electrode 133 and the second common electrode 195 are supplied with the same common voltage.

Figure 13:
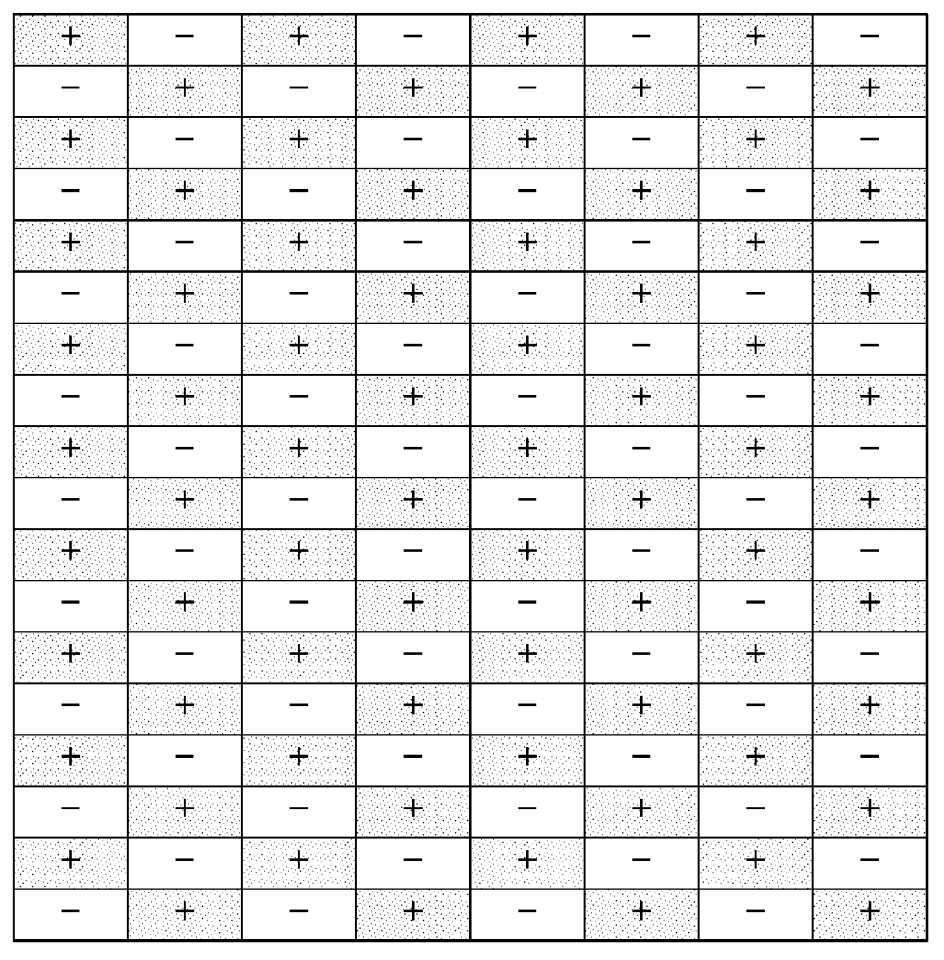
Figure 14:
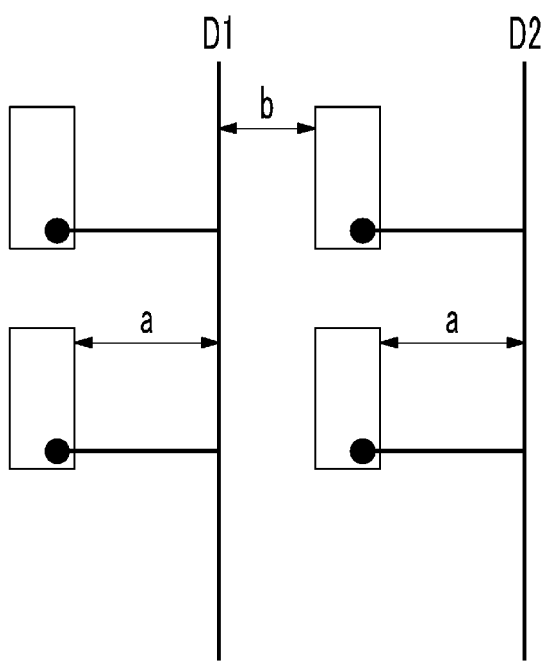
FIG. 14 is a view that illustrates the case of when an overlay error occurs in the manufacturing process of a thin film transistor array panel, according to an exemplary embodiment of the present invention.
Figure 15:
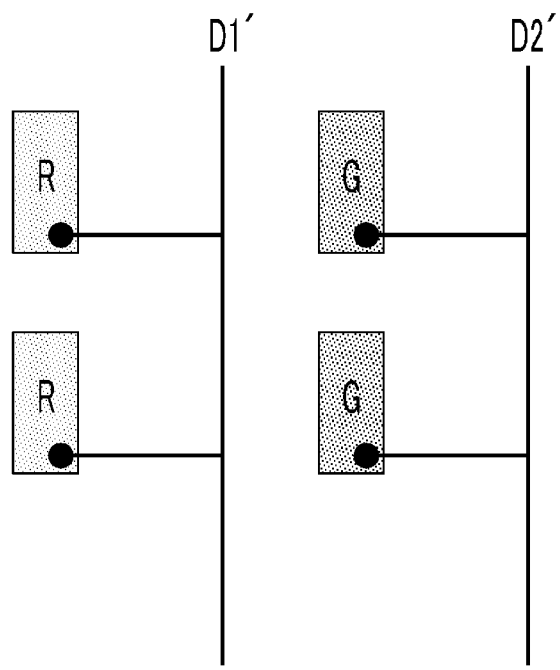
FIG. 15 is a view illustrating that colors of pixels are the same along a column direction in the thin film transistor array panel, according to an exemplary embodiment of the present invention.
Figure 16:
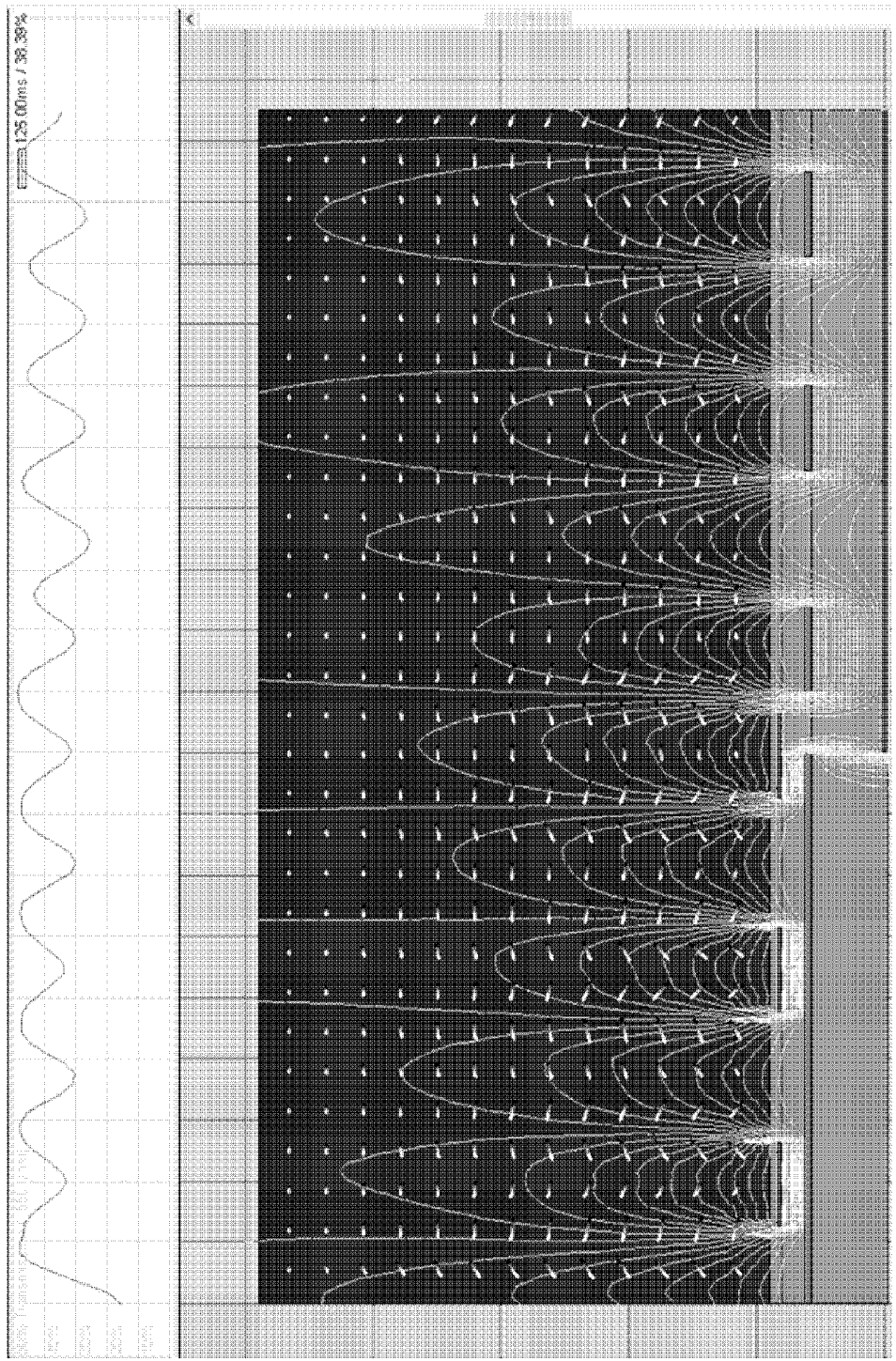
FIG. 16 is a view that illustrates transmittance in one pixel of the thin film transistor array panel, according to an exemplary embodiment of the present invention.

Hereinafter, the driving of a thin film transistor, according to the exemplary embodiments of the present invention, will be described. FIG. 13 is a view that illustrates polarity of each pixel when the thin film transistor array panel is driven, FIG. 14 is a view that illustrates the case where an error occurs in an overlay process, during the manufacturing of a thin film transistor array panel. FIG. 15 is a view illustrating that colors of pixels are the same in a column direction, in the thin film transistor array panel, and FIG. 16 is a view that illustrates the transmittance in one pixel of the thin film transistor array panel.

Referring to FIG. 13, when the thin film transistor is driven, a dot inversion effect occurs in a plurality of pixels. Data voltages having opposite polarities are applied to adjacent data lines. In this case, since the polarities of the electric fields that are formed in the upper pixel area and lower pixel area are opposite to each other, a dot inversion effect can occur, and power consumption is reduced.

Referring to FIG. 14, in the manufacturing process of the thin film transistor array panel, when an overlay error occurs, a distance (a), between the right sides of the pixel electrodes and data lines D1 and D2 is different from a distance (b) between the left sides of the pixel electrodes and the data lines D1 and D2r. In a conventional jet inversion manner, on the basis of one data line, since the thin film transistors are formed at the left and the right thereof, the capacitance of the pixel electrode disposed at the left of the data line D1 and the capacitance of the pixel electrode disposed at the right of the data line D1 are different from each other, such that defects occur in the pixel. In the exemplary embodiments of the present invention, on the basis of one data line, the thin film transistor protrudes in the same direction, such that the capacitances of the pixel electrodes connected to one data line are changed by the same degree. Thus, the above problem can be solved.

Referring to FIG. 15, in order for the thin film transistor array panel to produce only one color, such as red, green, or blue, power consumption may be lowered by driving only the corresponding data line. In the conventional jet inversion manner, in order to produce only one of the above colors, data lines adjacent to both sides of the corresponding pixels are driven. Thus, power consumption is increased. In the exemplary embodiments of the present invention, since all pixel electrodes disposed in the same column are connected to the same data line, only the data line adjacent to one side of the corresponding color pixels may be driven, such that the above problem can be solved.

Referring to FIG. 16, the left half of the graph shows the transmittance of the lower pixel area, and the right half shows the transmittance of the upper pixel area. In the lower pixel area, the electric field is formed between the second common electrode and the lower pixel electrode, and liquid crystal is disposed at just one the second common electrodes. However, in the upper pixel area, the electric field is formed between the first common electrode and upper pixel electrode, the second insulating layer is formed thereon, and liquid crystal is disposed thereon. That is, in the upper pixel area, the transmittance is slightly reduced, as compared to the lower pixel area, due to the second insulating layer.

In one pixel, visibility may be improved by making the transmittances of the upper pixel area and lower pixel area different from each other. However, in order to prevent excessive enlargement of the difference between the transmittances, it is preferable that the second insulating layer is formed with an appropriate thickness. As described above, the second insulating layer may be formed in the thickness in the range of about 500 Å to 2500 Å.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
   a substrate comprising pixel areas, each pixel area being divided into an upper pixel area and a lower pixel area that do not overlap in a first direction perpendicular to a plane of the substrate;
   a gate line and a data line disposed on the substrate and extending along edges of a first pixel area of the pixel areas;
   a thin film transistor connected to the gate line and the data line;
   a pixel electrode connected to the thin film transistor and comprising:
      an upper pixel electrode disposed in the upper pixel area of the first pixel area; and
      a lower pixel electrode disposed in the lower pixel area of the first pixel area;
   a first common electrode overlapped in the first direction by the upper pixel electrode, in the upper pixel area of the first pixel area;
   a second common electrode overlapping in the first direction the lower pixel electrode, in the lower pixel area of the first pixel area,
   a common voltage supply line disposed along an edge of the substrate and directly connected to the second common electrode; and
   a common electrode line disposed on the substrate and connected to the common voltage supply line and connected to the first common electrode,
   wherein:
      the first and second common electrodes do not overlap in the first direction; and
      the second common electrode extends from the common voltage supply line and covers multiple lower pixel areas of the pixel areas.

2. The thin film transistor array panel of claim 1, wherein:
   the upper pixel electrode comprises openings enclosed by the upper pixel electrode that face the first common electrode; and
   the second common electrode comprises openings enclosed by the second common electrode that face the lower pixel electrode.

3. The thin film transistor array panel of claim 2, wherein the openings in the upper pixel electrode and the openings in the second common electrode extend lengthwise, in a direction substantially parallel to the long axis of the gate line or the data line.

4. The thin film transistor array panel of claim 3, wherein the openings in the upper pixel electrode and the openings in the second common electrode are quadrilateral or ovoid.

5. The thin film transistor array panel of claim 2, wherein: the first common electrode faces the upper pixel electrode and completely covers the openings in the upper pixel electrode; and
   the lower pixel electrode faces the second common electrode and completely covers the openings in the second common electrode.

6. The thin film transistor array panel of claim 1, further comprising:
   a plurality of the data lines,
   wherein a first data voltage having a first polarity and a second data voltage having an opposite, second polarity are selectively applied to adjacent ones of the data lines.

7. The thin film transistor array panel of claim 6, wherein:
   the first data voltage and the second data voltage are applied during a frame; and
   the first data voltage and the second data voltage are alternated and applied during a subsequent frame.

8. The thin film transistor array panel of claim 7, wherein:
   a first electric field having a first polarity is formed between the first common electrode and the upper pixel electrode; and
   a second electric field having an opposite second polarity is formed between the second common electrode and the lower pixel electrode.

9. The thin film transistor array panel of claim 1, further comprising:
   a first insulating layer disposed between the first common electrode and the pixel electrode; and
   a second insulating layer disposed between the pixel electrode and the second common electrode.

10. The thin film transistor array panel of claim 9, wherein:
    the first insulating layer has a thickness in the range of 3500 Å to 4500 Å; and
    the second insulating layer has a thickness in the range of 500 Å to 2500 Å.

11. The thin film transistor array panel of claim 1, wherein the pixel electrode, the first common electrode, and the second common electrode are made of the same material.

12. The thin film transistor array panel of claim 1, wherein the array panel comprises a plurality of the thin film transistors, and the thin film transistors extend from the data line in the same direction.

13. The thin film transistor array panel of claim 1, wherein the first common electrode is disposed under the common electrode line.

14. The thin film transistor array panel of claim 1, wherein a semiconductor layer of the thin film transistor is disposed under the data line.

15. A thin film transistor array panel comprising:
    a substrate having a pixel area that is divided into an upper pixel area and a lower pixel area that do not overlap in a first direction perpendicular to a plane of the substrate;
    a gate line disposed on the substrate and comprising a gate electrode;
    a common electrode line extending in parallel to the gate line;
    a first common electrode overlapping the common electrode line and disposed in the upper pixel area;
    a first insulating layer disposed on the gate line, the gate electrode, the common electrode line, and the first common electrode;
    a semiconductor layer disposed on the first insulating layer and corresponding to the gate electrode;
    a data line extending across the gate line and comprising a source electrode;
    a drain electrode spaced apart from the data line on the semiconductor layer;
    a pixel electrode comprising:
       an upper pixel electrode disposed in the upper pixel area; and a lower pixel electrode connected to the drain electrode and disposed in the lower pixel area;

a second insulating layer disposed on the source electrode, the drain electrode, and the pixel electrode; and a second common electrode disposed in the lower pixel area and on the second insulating layer, wherein, the first common electrode overlapped in the first direction by the upper pixel electrode, in the upper pixel area, the second common electrode overlapping in the first direction the lower pixel electrode, in the lower pixel area, and the first and second common electrodes do not overlap in the first direction.

16. The thin film transistor array panel of claim 15, wherein:

the upper pixel electrode comprises openings enclosed by the upper pixel electrode that face the first common electrode; and the second common electrode comprises openings enclosed by the second common electrode that face the lower pixel electrode.

17. The thin film transistor array panel of claim 16, wherein the openings in the upper pixel electrode and the openings in the second common electrode extend lengthwise, in a direction parallel to the long axis of the gate line or the data line.

18. The thin film transistor array panel of claim 17, wherein the openings in the upper pixel electrode and the openings in the second common electrode are quadrilateral or ovoid.

19. The thin film transistor array panel of claim 16, wherein:

the first common electrode faces the upper pixel electrode and completely covers the openings in the upper pixel electrode; and the lower pixel electrode faces the second common electrode and completely covers the openings in the second common electrode.

20. The thin film transistor array panel of claim 15, further comprising:

a common voltage supply line disposed at an edge of the substrate, wherein the common voltage supply line is disposed on the same layer as the data line.

21. The thin film transistor array panel of claim 20, further comprising:

a first contact hole formed in the second insulating layer, so as to expose a portion of the common voltage supply line;

a second contact hole formed in the first insulating layer and the second insulating layer, so as to expose a portion of the common electrode line; and a connection electrode that is connected to the common voltage supply line and the common electrode line through the first contact hole and the second contact hole.

22. The thin film transistor array panel of claim 20, further comprising:

a third contact hole formed in the second insulating layer, so as to expose a portion of the common voltage supply line, wherein the second common electrode is connected to the common voltage supply line through the third contact hole.

23. The thin film transistor array panel of claim 22, wherein the second common electrode covers multiple lower pixel areas of a plurality of pixel areas.

24. The thin film transistor array panel of claim 15, wherein the first insulating layer and the second insulating layer comprise an inorganic insulating material.

25. The thin film transistor array panel of claim 15, wherein the array panel comprises a plurality of the source electrodes that extend from the data line in the same direction.

26. The thin film transistor array panel of claim 15, wherein the first common electrode is disposed under the common electrode line.

27. The thin film transistor array panel of claim 15, wherein the semiconductor layer is disposed under the data line.

* * * * *